United States Patent
Yoon et al.

(10) Patent No.: US 10,872,817 B2
(45) Date of Patent: Dec. 22, 2020

(54) SEMICONDUCTOR DEVICE AND METHOD OF MANUFACTURING THE SAME

(71) Applicant: Samsung Electronics Co., Ltd., Suwon-si (KR)

(72) Inventors: Daeho Yoon, Gwacheon-si (KR); Daeseon Jeon, Hwaseong-si (KR); Jaeyoung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 16/022,965

(22) Filed: Jun. 29, 2018

(65) Prior Publication Data

US 2019/0172824 A1 Jun. 6, 2019

(30) Foreign Application Priority Data

Dec. 1, 2017 (KR) .......................... 10-2017-0164435

(51) Int. Cl.
*H01L 21/768* (2006.01)
*H01L 27/02* (2006.01)
(Continued)

(52) U.S. Cl.
CPC ...... *H01L 21/76892* (2013.01); *G06F 30/394* (2020.01); *G06F 30/398* (2020.01);
(Continued)

(58) Field of Classification Search
CPC ...... G06F 30/398; G06F 30/394; G06F 3/048; G06F 11/00; G06F 11/0751; G06F 11/3065; G06F 11/34; G06F 30/392; H01L 27/0207; H01L 21/76892; H01L 21/768; H01L 23/528; H01L 21/76816; H04M 1/72569;
(Continued)

(56) References Cited

U.S. PATENT DOCUMENTS 6,519,758 B2 * 2/2003 Miyagawa ................ G03F 1/78
716/52
6,813,756 B2 * 11/2004 Igarashi ................ G06F 30/394
327/156

(Continued)

FOREIGN PATENT DOCUMENTS

KR 10-2014-0029050 A 3/2014

OTHER PUBLICATIONS

Wojtowecz et al.; Rapid yield ramp using closed loop DFM and overlay process window qualification flow:; 2018 29th Annual SEMI Advanced Semiconductor Manufacturing Conference (ASMC); Conference Paper | Publisher: IEEE (Year: 2018).*

*Primary Examiner* — Helen Rossoshek
(74) *Attorney, Agent, or Firm* — Harness, Dickey & Pierce, P.L.C.

(57) ABSTRACT

Disclosed are semiconductor devices and methods of manufacturing the same. The method comprises providing a layout comprising a first group that includes first and second patterns and a second group that includes third and fourth patterns, examining a bridge risk region in the layout, biasing one end of at least one of the first and third patterns, and forming first to fourth conductive patterns by respectively using the first to fourth patterns of the layout. The one end of at least one of the first and third patterns are adjacent to the bridge risk region.

20 Claims, 23 Drawing Sheets

(51) Int. Cl.
  *H01L 23/528* (2006.01)
  *G06F 30/394* (2020.01)
  *G06F 30/398* (2020.01)

(52) U.S. Cl.
  CPC .......... *H01L 21/768* (2013.01); *H01L 23/528* (2013.01); *H01L 27/0207* (2013.01)

(58) Field of Classification Search
  CPC ............. H04M 1/725; H04M 1/72577; H04M 2242/15
  See application file for complete search history.

(56) References Cited

U.S. PATENT DOCUMENTS

| | | | | |
|---|---|---|---|---|
| 7,194,725 | B1 * | 3/2007 | Lukanc | G06F 30/398 716/52 |
| 7,385,689 | B2 * | 6/2008 | Kim | G01N 21/21 356/237.4 |
| 7,434,195 | B2 * | 10/2008 | Hsu | G03F 1/36 382/144 |
| 7,475,383 | B2 * | 1/2009 | Suh | G03F 1/36 378/35 |
| 7,540,970 | B2 * | 6/2009 | Koh | G03F 7/0035 216/37 |
| 7,568,180 | B2 * | 7/2009 | Eisenmann | G03F 7/705 716/56 |
| 7,884,325 | B2 * | 2/2011 | Sohda | G03F 7/70541 250/306 |
| 7,958,463 | B2 * | 6/2011 | Ikeuchi | G06F 30/398 716/54 |
| 8,234,596 | B2 * | 7/2012 | Ogawa | G03F 1/36 716/50 |
| 8,418,088 | B2 * | 4/2013 | Ye | G03F 7/705 716/55 |
| 8,434,033 | B2 | 4/2013 | Abou Ghaida et al. | |
| 8,443,309 | B2 * | 5/2013 | Abdo | G03F 1/44 716/53 |
| 8,452,076 | B2 * | 5/2013 | Nakagaki | G06K 9/6256 382/149 |
| 8,516,399 | B2 | 8/2013 | Paris et al. | |
| 8,631,379 | B2 * | 1/2014 | Chen | G06F 30/398 716/132 |
| 8,644,589 | B2 * | 2/2014 | Hsu | G03F 1/36 382/144 |
| 8,692,380 | B2 * | 4/2014 | Tan | G03F 1/36 257/773 |
| 8,792,147 | B2 * | 7/2014 | Tejnil | H04N 1/6033 358/1.9 |
| 8,841,675 | B2 * | 9/2014 | Saito | H01L 29/7869 257/350 |
| 8,863,048 | B1 | 10/2014 | Gerousis et al. | |
| 8,914,755 | B1 * | 12/2014 | Hsu | G03F 7/70433 716/55 |
| 8,994,151 | B2 * | 3/2015 | Yasuzato | H01L 21/76816 257/622 |
| 9,009,633 | B2 * | 4/2015 | Wu | G03F 1/36 716/53 |
| 9,104,833 | B2 * | 8/2015 | Kuo | G03F 1/70 |
| 9,141,751 | B2 | 9/2015 | Lee et al. | |
| 9,158,885 | B1 | 10/2015 | Gray et al. | |
| 9,335,624 | B2 | 5/2016 | Lee et al. | |
| 9,390,206 | B2 * | 7/2016 | Ye | G06F 30/20 |
| 9,652,579 | B1 | 5/2017 | Arkhipov et al. | |
| 9,858,658 | B2 * | 1/2018 | Kaizerman | G06T 7/001 |
| 10,185,798 | B2 * | 1/2019 | Kim | H01L 21/823871 |
| 10,216,082 | B2 * | 2/2019 | Kang | G03F 1/70 |
| 10,325,058 | B2 * | 6/2019 | Lee | G01R 31/2887 |
| 10,657,207 | B1 * | 5/2020 | Tang | G06F 30/367 |
| 2009/0217224 | A1 * | 8/2009 | Wiaux | G03F 7/70475 716/106 |
| 2013/0134415 | A1 * | 5/2013 | Godo | H01L 29/66969 257/43 |
| 2013/0178067 | A1 * | 7/2013 | Yu | H01L 21/76816 438/699 |
| 2014/0131879 | A1 * | 5/2014 | Kodama | G06F 30/392 257/773 |
| 2014/0183702 | A1 * | 7/2014 | Kodama | H01L 21/0337 257/618 |
| 2015/0045935 | A1 * | 2/2015 | Cao | G03F 7/70525 700/120 |
| 2015/0214291 | A1 * | 7/2015 | Park | H01L 27/10855 257/503 |
| 2016/0071684 | A1 * | 3/2016 | Platzgummer | H01J 37/3177 250/396 R |
| 2016/0246168 | A1 * | 8/2016 | Ye | G03F 7/70441 |
| 2016/0276266 | A1 * | 9/2016 | Liu | H01L 21/76807 |
| 2016/0327856 | A1 * | 11/2016 | Jeong | G06F 30/398 |
| 2017/0077029 | A1 * | 3/2017 | Nelson | H01J 37/045 |
| 2017/0269481 | A1 * | 9/2017 | Borodovsky | G03F 7/2037 |
| 2018/0322234 | A1 * | 11/2018 | Cao | G06F 30/39 |
| 2019/0087526 | A1 * | 3/2019 | Park | G06F 30/18 |
| 2020/0004921 | A1 * | 1/2020 | Baidya | G06N 5/022 |

* cited by examiner

SEMICONDUCTOR DEVICE AND METHOD OF MANUFACTURING THE SAME

CROSS-REFERENCE TO RELATED APPLICATIONS

This U.S. nonprovisional application claims priority under 35 U.S.C § 119 to Korean Patent Application No. 10-2017-0164435 filed on Dec. 1, 2017, in the Korean Intellectual Property Office, the entire contents of which are hereby incorporated by reference.

BACKGROUND

Inventive concepts relate to a semiconductor device and a method of manufacturing the same, and more particularly, to a semiconductor device including conductive patterns on a substrate and a method of manufacturing the same.

Semiconductor devices are beneficial in electronic industry because of their small size, multi-functionality, and/or low fabrication cost. Semiconductor device may be categorized as one of a semiconductor memory device storing logic data, a semiconductor logic device processing operations of logic data, and a hybrid semiconductor device having both memory and logic elements. A semiconductor device has been increasingly required for higher integration with the advanced development of the electronic industry. For example, a semiconductor device has been increasingly requested for higher reliability, higher speed, and/or multi-functionality. A semiconductor device is gradually complicated and integrated to meet these requested characteristics.

SUMMARY

Some example embodiments of inventive concepts provide a semiconductor device with improved reliability due to reduction in process risk.

Some example embodiments of inventive concepts provide a method of manufacturing a semiconductor device in which the method has an improvement in reliability due to the reduction in process risk.

According to example embodiments of inventive concepts, a method of manufacturing a semiconductor device may comprise: providing a layout comprising a first group and a second group, the first group including a first pattern and a second pattern, the second group including a third pattern and a fourth pattern; examining a bridge risk region in the layout; biasing one end of at least one of the first and third patterns; and forming first to fourth conductive patterns by respectively using the first to fourth patterns of the layout. The one end of at least one of the first and third patterns may be adjacent to the bridge risk region.

According to example embodiments of inventive concepts, a method of manufacturing a semiconductor device may comprise: providing a layout; performing a line-end biasing on the layout; and using the layout to form conductive patterns on a substrate. The operation of performing the line-end biasing comprises: examining a bridge risk region in the layout; biasing one end of at least one of patterns in the layout, the one end being adjacent to the bridge risk region; and performing a design rule check.

According to example embodiments of inventive concepts, a semiconductor device may comprise: a substrate; and first, second, third, and fourth conductive patterns on the substrate. The first to fourth conductive patterns may extend in parallel to each other in a first direction. The first to fourth conductive patterns may be sequentially arranged in a second direction crossing the first direction. The third conductive pattern may comprise on its one side a first extension protruding toward the first conductive pattern. The second conductive pattern may comprise on its one side a second extension protruding toward the fourth conductive pattern. The first extension and the second extension may be spaced apart from each other in the first direction. The first extension may be aligned in the second direction with one end of the first conductive pattern. The second extension may be aligned in the second direction with one end of the fourth conductive pattern.

DETAILED DESCRIPTION OF EXAMPLE EMBODIMENTS

Figure 1:
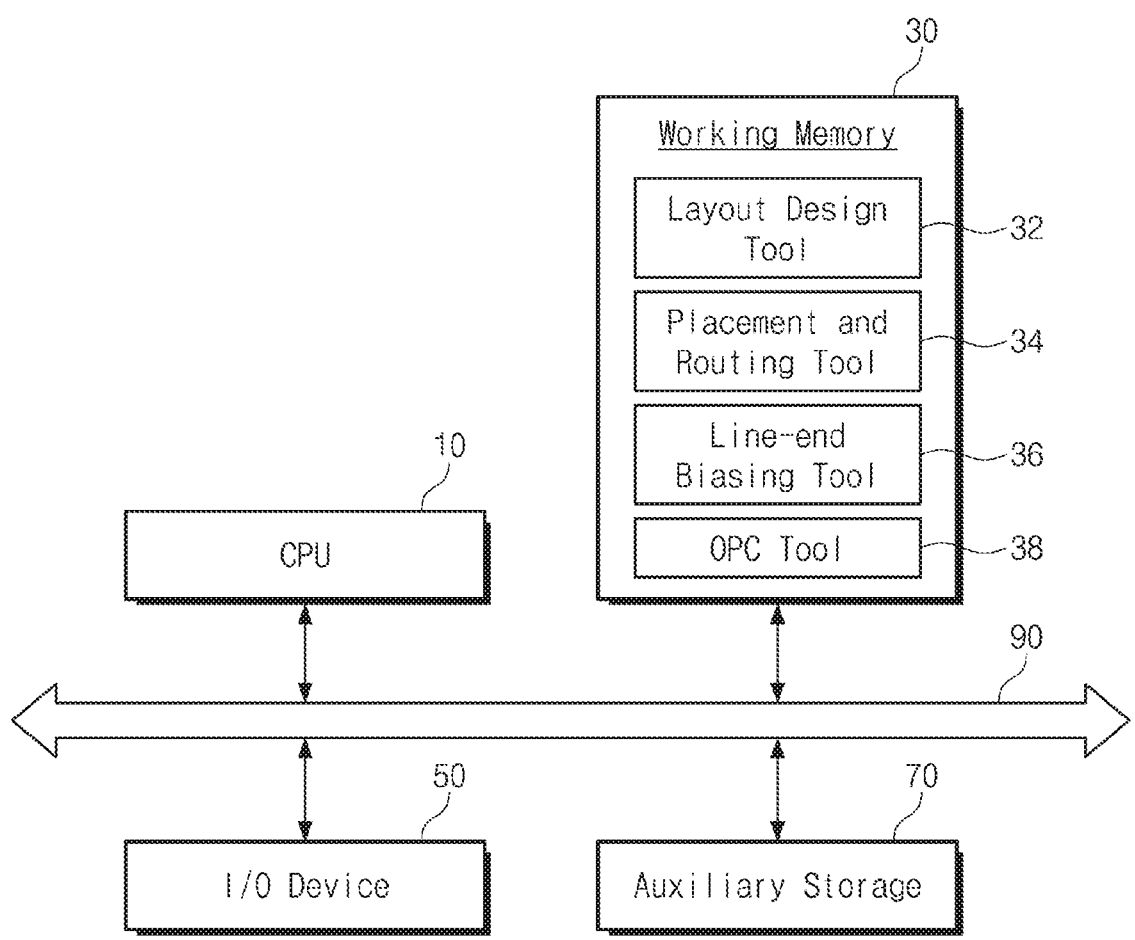
FIG. 1 illustrates a block diagram showing a computer system for designing a semiconductor device, according to example embodiments of inventive concepts.

FIG. 1 illustrates a block diagram showing a computer system for designing a semiconductor device, according to example embodiments of inventive concepts. Referring to FIG. 1, a computer system may include a central processing unit (CPU) 10, a working memory 30, an input/output (I/O) device 50, and an auxiliary storage 70. The computer system may be provided as a dedicated device for designing a layout according to example embodiments of inventive concepts. The computer system may be configured to drive various design and verification simulation programs.

The CPU 10 may allow the computer system to execute software (e.g., application programs, operating system, and device drivers). The CPU 10 may process an operating system loaded in the working memory 30. The CPU 10 may execute various application programs driven based on the operating system. For example, the CPU 10 may process a layout design tool 32, a placement and routing tool 34, a line-end biasing tool 36, and/or an OPC tool 38 loaded in the working memory 30.

The operating system or application programs may be loaded in the working memory 30. When the computer system is booted up, based on booting sequence, an operating system image (not shown) stored in the auxiliary storage 70 may be loaded to the working memory 30. Overall input/output operations of the computer system may be supported by the operating system. Likewise, the working memory 30 may be loaded with the application programs that are selected by a user or provided for a basic service.

The layout design tool 32 for layout design may be loaded from the auxiliary storage 70 to the working memory 30. The working memory 30 may be loaded from the auxiliary storage 70 with the placement and routing tool 34 that places designed standard cells and routes the placed standard cells.

The line-end biasing tool 36 may be loaded from the auxiliary storage 70 to the working memory 30. The working memory 30 may be loaded from the auxiliary storage 70 with the OPC tool 38 that performs an optical proximity correction (OPC) on designed layout data.

The layout design tool 32 may include a bias function by which specific layout patterns are changed in shapes and positions defined by a design rule. In addition, the layout design tool 32 may perform a design rule check (DRC) under the changed bias data condition. The working memory 30 may be either a volatile memory such as SRAM (Static Random Access Memory) or DRAM (Dynamic Random Access Memory) or a nonvolatile memory such as PRAM (Phase change Random Access Memory), MRAM (Magnetic Random Access Memory), ReRAM (Resistance Random Access Memory), FRAM (Ferroelectric Random Access Memory), or NOR Flash memory.

The line-end biasing tool 36 may include a bias function for changing layout patterns in the placed standard cells. For example, the line-end biasing tool 36 may extend or pull back one end of the layout pattern. The line-end biasing tool 36 may execute a design rule check (DRC) under the changed bias data condition.

The I/O device 50 may control user input/output operations of user interfaces. For example, the I/O device 50 may include a keyboard or a monitor, allowing a designer to put relevant information. The user may use the I/O device 50 to receive information about a semiconductor region or data paths requiring adjusted operating characteristics. The I/O device 50 may display a progress status or a process result of the OPC tool 38.

The auxiliary storage 70 may serve as a storage medium for the computer system. The auxiliary storage 70 may store the application programs, the operating system image, and various data. The auxiliary storage 70 may be provided in the form of one among memory cards (e.g., MMC, eMMC, SD, and Micro SD) and a hard disk drive (HDD). The auxiliary storage 70 may include a NAND Flash memory having large memory capacity. Alternatively, the auxiliary storage 70 may include a NOR Flash memory or a next-generation volatile memory such as PRAM, MRAM, ReRAM, and FRAM.

A system interconnector 90 may be provided to serve as a system bus for providing a network in the computer system. The CPU 10, the working memory 30, the I/O device 50, and the auxiliary storage 70 may be electrically connected through the system interconnector 90 and may exchange data with each other. The system interconnector 90 may not be limited to the above descriptions. For example, the system interconnector 90 may further include additional elements for increasing efficiency in data communication.

Figure 2:
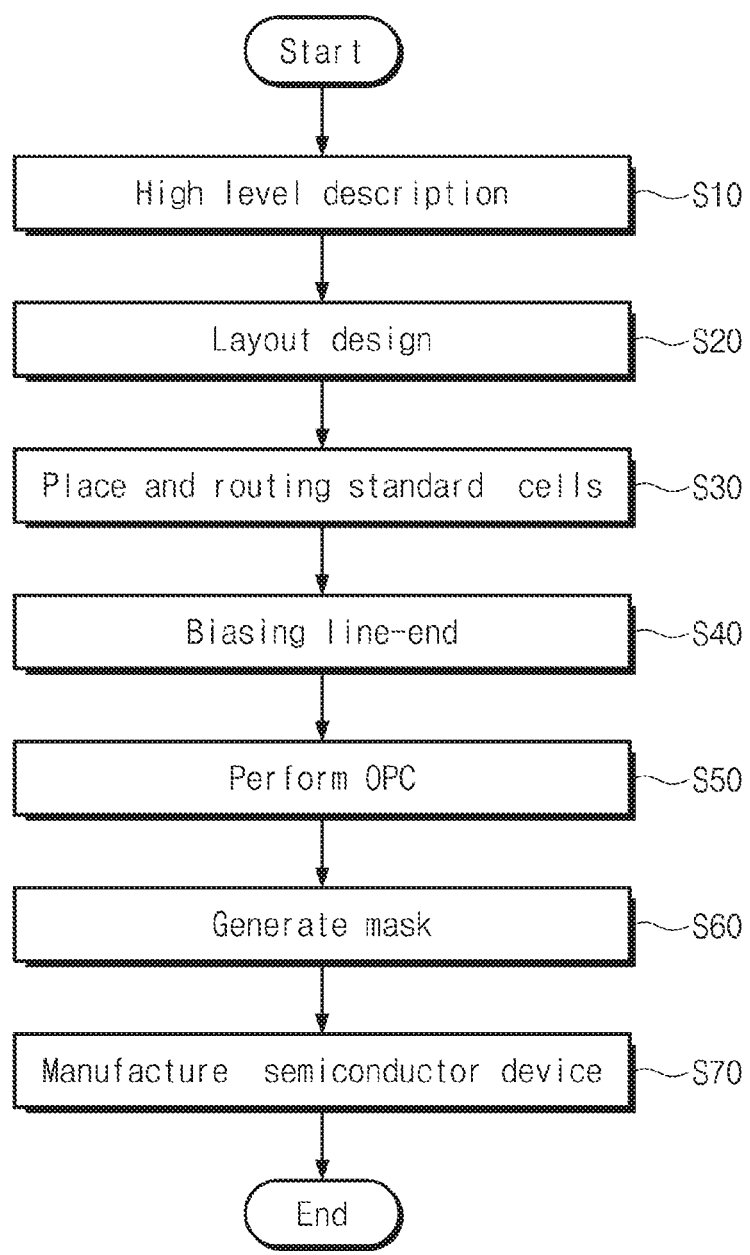
FIG. 2 illustrates a flow chart showing a method of designing and manufacturing a semiconductor device, according to example embodiments of inventive concepts.

FIG. 2 illustrates a flow chart showing a method of designing and manufacturing a semiconductor device, according to example embodiments of inventive concepts.

Referring to FIG. 2, a high-level description operation of a semiconductor integrated circuit may be performed using the computer system discussed with reference to FIG. 1 (S10). The high-level description operation may mean that an integrated circuit corresponding to a design target is described with a high-level language of a hardware description language. For example, the high-level language such as C language may be used in the high level design process. A register transfer level (RTL) coding or simulation may be used to express circuits designed by the high-level design process. In addition, codes created by the RTL coding may be converted into a netlist, and the netlist may be synthesized to describe an entire semiconductor device. The synthesized schematic circuit may be verified by a simulation tool, and an adjustment process may be performed based on the verified result.

A layout design operation may be performed to implement on a silicon substrate a semiconductor integrated circuit that is logically completed (S20). For example, the layout design operation may be performed based on the schematic circuit synthesized in the high-level design operation or the netlist corresponding to the schematic circuit. The layout design operation may include a routing process that places and connects various standard cells provided from a cell library, based on a prescribed design rule.

The cell library for the layout design operation may include information about operation, speed, and power consumption of the standard cell. A cell library for representing a layout of a specific gate-level circuit as a layout may be defined in the layout design tool. The layout may be prepared to define shapes or dimensions of patterns constituting transistors and metal lines that will be actually formed on a silicon substrate. For example, in order to actually form an inverter circuit on a silicon substrate, it may be necessary to appropriately place or describe layout patterns such as PMOS, NMOS, N-WELL, gate electrodes, and metal lines thereon. For this, a search may be first performed to select a suitable one of inverters predefined in the cell library.

A routing operation may be performed on the selected and placed standard cells (S30). For example, high-level lines may be provided on the placed standard cells. The standard cells may be well-designedly connected to each other through the routing operation. The placement and routing of the standard cells may be automatically performed by the placement and routing tool 34.

After the routing operation, the layout may be examined to determine whether or not a bridge risk region is present. When it is determined that the bridge risk region is present, the layout pattern may be biased (changed) in its line-end causing the bridge risk region (S40). The line-end biasing tool 36 may execute the search of the bridge risk region and the biasing of the line-end.

A verification operation may be performed on the layout to check whether any portion of the schematic circuit violates the given design rule. The verification operation may include a design rule check (DRC) for verifying whether the layout meets the given design rule, an electrical rule check (ERC) for verifying whether there is an issue of an electrical disconnection in the layout, and a layout vs. schematic (LVS) for verifying whether the layout is coincident with the gate-level netlist.

An optical proximity correction (OPC) operation may be performed (S50). A photolithography process may be employed to realize on a silicon substrate the layout patterns obtained by the layout design operation. The optical proximity correction operation may be a technique for correcting an unintended optical effect occurred in the photolithography process. For example, the optical proximity correction process may correct an undesirable phenomenon such as refraction or process side effects caused by characteristics of light in an exposure process using the layout patterns. When the optical proximity correction operation is performed, the designed layout patterns may be slightly changed in their shapes and positions.

A photomask may be generated based on the layout changed by the optical proximity correction operation (S60). The photomask may generally be manufactured by describing the layout patterns using a chromium layer coated on a glass substrate.

The generated photomask may be used to manufacture a semiconductor device (S70). Various exposure and etching processes may be repeatedly performed in fabricating the semiconductor device using the photomask. Through these processes described above, patterns defined in the layout design operation may be sequentially formed on a silicon substrate.

Figure 3:
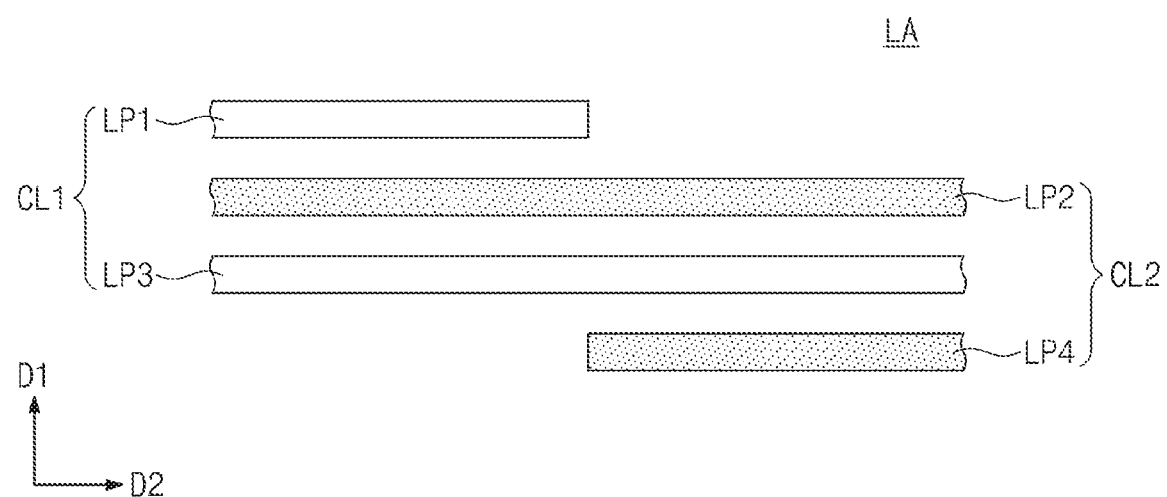
FIG. 3 illustrates a plan view showing a layout according to example embodiments of inventive concepts.

FIG. 3 illustrates a plan view showing a layout according to example embodiments of inventive concepts.

Referring to FIG. 3, there may be provided a layout LA according to some example embodiments of inventive concepts. The layout LA of FIG. 3A may define conductive patterns that are supposed to be formed on one among stacked layers of a semiconductor device. For example, the conductive patterns may be or include contacts, wiring lines, or vias.

The layout LA may include first to fourth patterns LP1 to LP4. Each of the first to fourth patterns LP1 to LP4 may have a linear or bar shape extending in a second direction D2. The first to fourth patterns LP1 to LP4 may be spaced apart from each other in a first direction D1. Neighboring ones of the first to fourth patterns LP1 to LP4 may be arranged at substantially the same pitch. For example, a pitch between the first pattern LP1 and the second pattern LP2 may be substantially the same as a pitch between the second pattern LP2 and the third pattern LP3. The pitch between the second pattern LP2 and the third pattern LP3 may be substantially the same as a pitch between the third pattern LP3 and the fourth pattern LP4. The term pitch may mean a distance in the first direction D1 between one side of a pattern and one side of an adjacent pattern.

The first pattern LP1 and the third pattern LP3 may constitute a first group CL1. The second pattern LP2 and the fourth pattern LP4 may constitute a second group CL2. A first photomask may be fabricated based on the first group CL1, and a second photomask may be fabricated based on the second group CL2. For example, the layout LA of FIG. 3 may be used to separately fabricate a total of two photomasks. The first and second photomasks may be used to form respective patterns on a substrate. For example, the first and third patterns LP1 and LP3 included in the first group CL1 of the layout LA may be displayed in the same first color, and the second and fourth patterns LP2 and LP4 included in the second group CL2 of the layout LA may be displayed in the same second color.

Figure 4A:
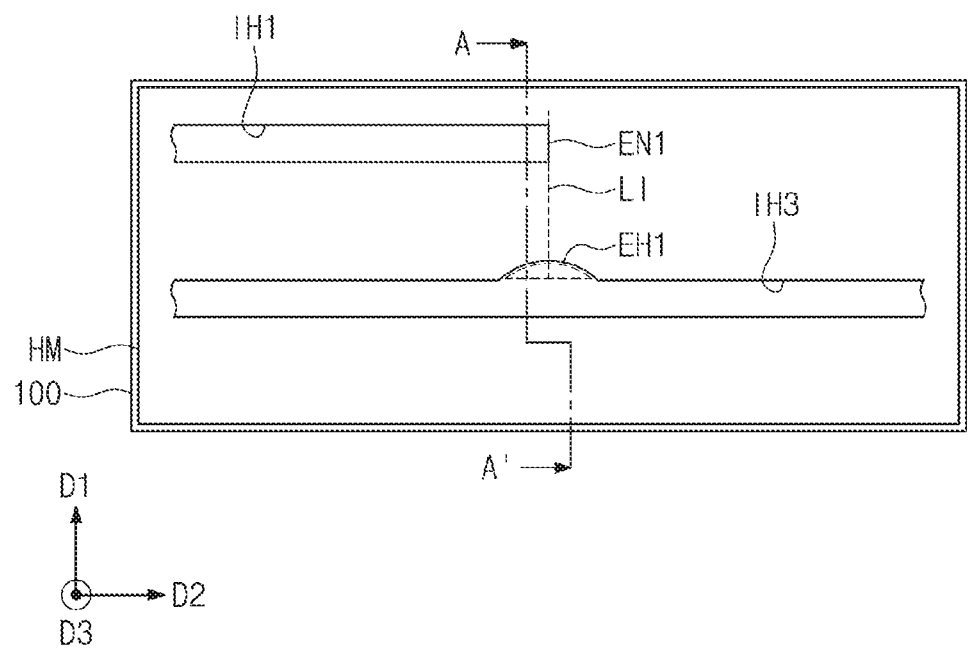
FIGS. 4A, 5A, and 6A illustrate plan views showing a method of manufacturing a semiconductor device on a substrate based on the layout of FIG. 3.
Figure 4B:
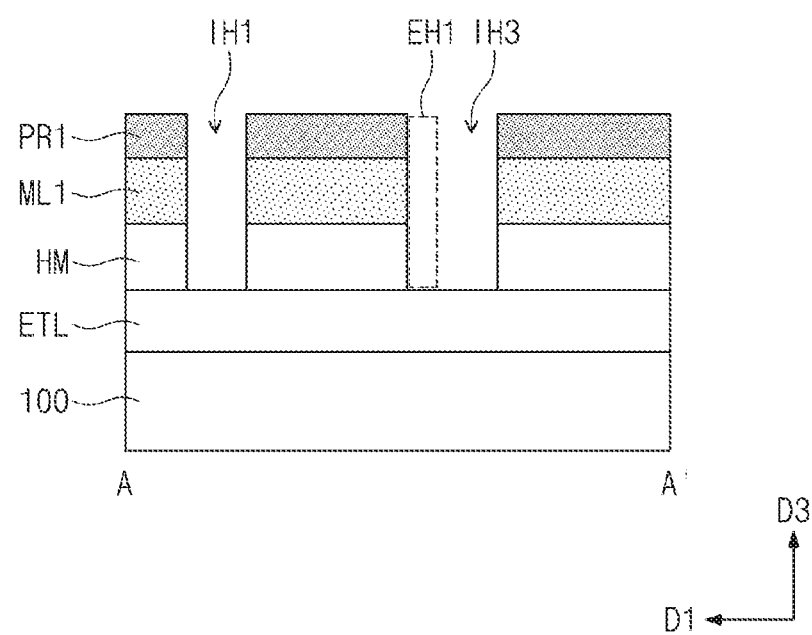
FIGS. 4B, 5B, and 6B illustrate cross-sectional views taken along line A-A' of FIGS. 4A, 5A, and 6A, respectively.
Figure 5A:
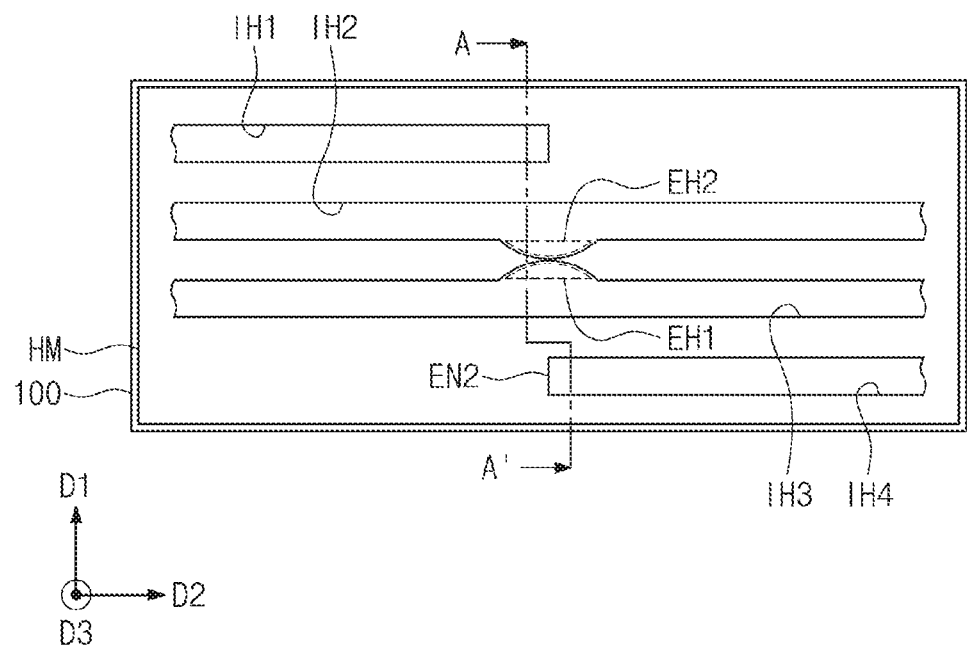
Figure 5B:
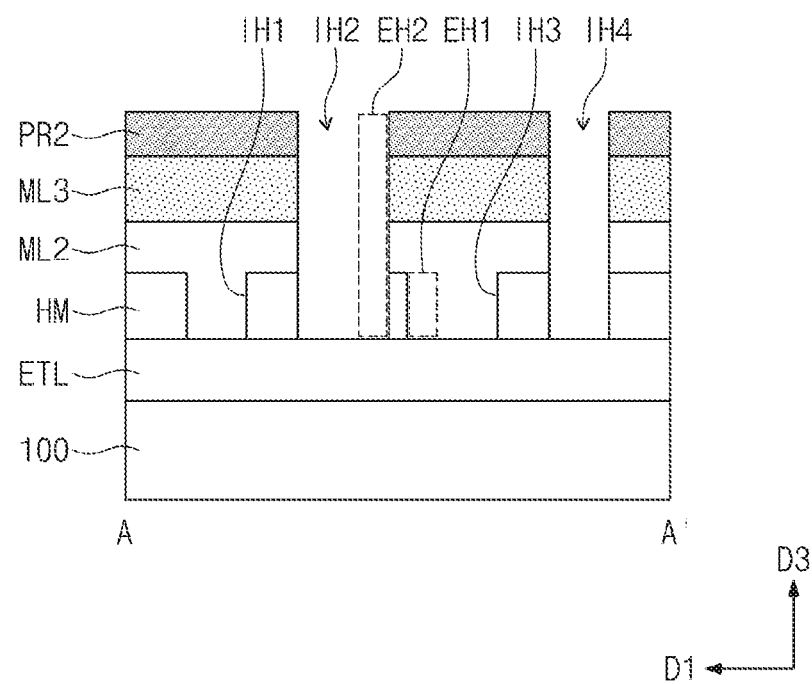
Figure 6A:
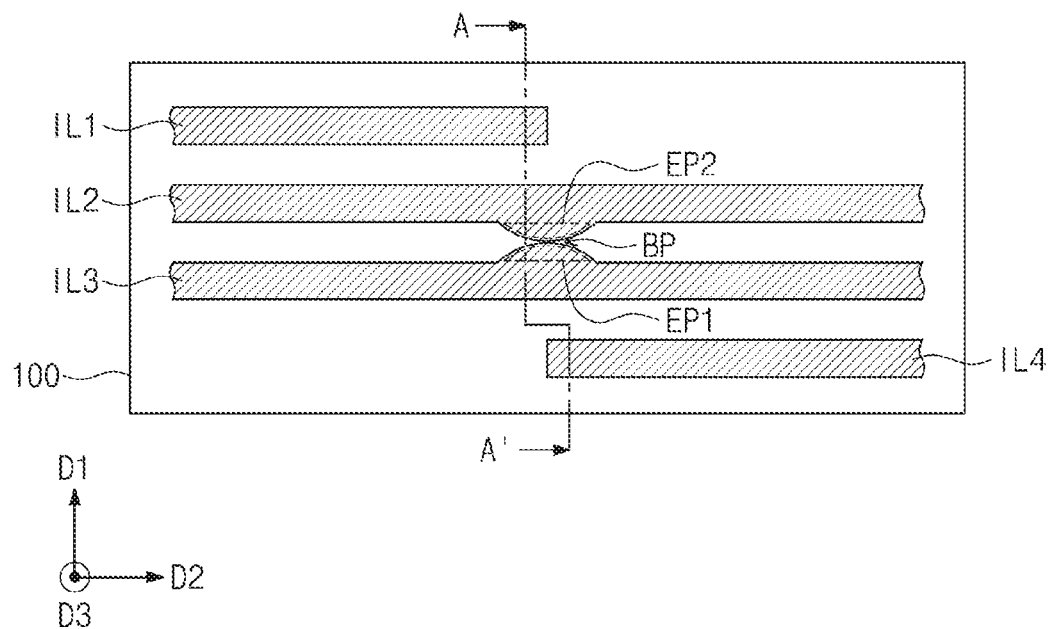
Figure 6B:
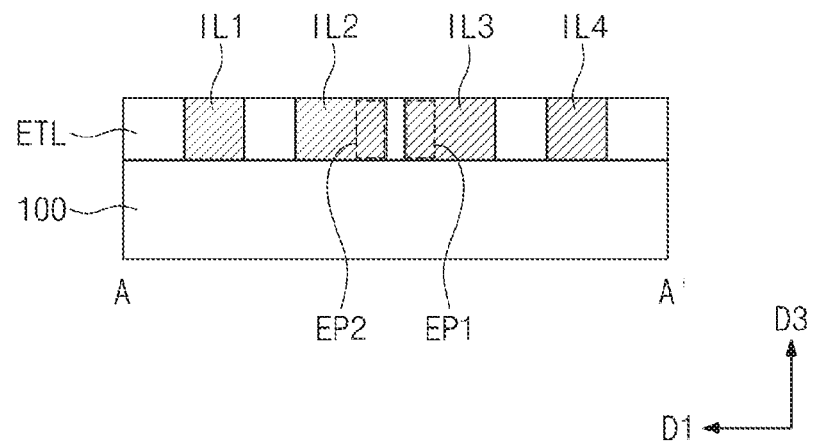

FIGS. 4A, 5A, and 6A illustrate plan views showing a method of manufacturing a semiconductor device based on the layout of FIG. 3. FIGS. 4B, 5B, and 6B illustrate cross-sectional views taken along line A-A' of FIGS. 4A, 5A, and 6A, respectively.

Referring to FIGS. 4A and 4B, a substrate 100 may be provided to include an active region. Although not shown, transistors may be disposed on the active region of the substrate 100. An etching target layer ETL, a mask layer HM, and a first mold layer ML1 may be sequentially formed on the substrate 100. The etching target layer ETL and the mask layer HM may have etch selectivity to each other. The first photomask, which is fabricated based on the first group CL1 of FIG. 3, may be used to form a first photoresist pattern PR1 on the first mold layer ML1. The first photoresist pattern PR1 may be formed using a photolithography process. For example, the formation of the first photoresist pattern PR1 may include forming a first photoresist layer on the first mold layer ML1 and using the first photomask to perform exposure and development processes on the first photoresist layer.

The first photoresist pattern PR1 may be used as an etching mask to sequentially etch the first mold layer ML1 and the mask layer HM. A first hole IH1 and a third hole IH3 may then be formed to partially expose the etching target layer ETL. The first hole IH1 and the third hole IH3 may be defined respectively by the first pattern LP1 and the third pattern LP3 of FIG. 3.

A pattern distortion may occur in the photolithography process. As a result, a first extension hole EH1 may be formed at a region adjacent to an end EN1 of the first hole IH1. The third hole IH3 may include the first extension hole EH1. The first extension hole EH1 may have a shape that protrudes in the first direction D1 from the third hole IH3. For example, the first extension hole EH1 may have a shape that protrudes from the third hole IH3 toward the first hole IH1. When viewed in plan, the first extension hole EH1 may be aligned in the first direction D1 with the end EN1 of the first hole IH1. For example, a line LI in the first direction D1 passing through a center of the first extension hole EH1 may substantially overlap the end EN1 of the first hole IH1. In conclusion, the pattern distortion in the photolithography process may cause the third hole IH3 to have a planar shape different from that of the third pattern LP3 of FIG. 3.

Referring to FIGS. 5A and 5B, the first photoresist pattern PR1 and the first mold layer ML1 may be removed. A second mold layer ML2 may be formed to cover the mask layer HM. A third mold layer ML3 may be formed on the second mold layer ML2. The second photomask, which is fabricated based on the second group CL2 of FIG. 3, may be used to form a second photoresist pattern PR2 on the third mold layer ML3. The second photoresist pattern PR2 may be formed using a photolithography process. For example, the formation of the second photoresist pattern PR2 may include forming a second photoresist layer on the third mold layer ML3 and using the second photomask to perform exposure and development processes on the second photoresist layer.

The second photoresist pattern PR2 may be used as an etching mask to sequentially etch the third mold layer ML3, the second mold layer ML2, and the mask layer HM. A second hole IH2 and a fourth hole IH4 may then be formed to partially expose the etching target layer ETL. The second hole IH2 and the fourth hole IH4 may be defined respectively by the second pattern LP2 and the fourth pattern LP4 of FIG. 3.

A pattern distortion may occur in the photolithography process. As a result, a second extension hole EH2 may be formed at a region adjacent to an end EN2 of the fourth hole IH4. The second hole IH2 may include the second extension hole EH2. The second extension hole EH2 may have a shape that protrudes from the second hole IH2 toward the fourth hole IH4. When viewed in plan, the second extension hole EH2 may be aligned in the first direction D1 with the end EN2 of the fourth hole IH4. The first extension hole EH1 and the second extension hole EH2 may adjoin each other. For example, the first extension hole EH1 and the second extension hole EH2 may be connected to each other. In conclusion, the pattern distortion in the photolithography process may cause the second hole IH2 to have a planar shape different from that of the second pattern LP2 of FIG. 3.

Referring to FIGS. 6A and 6B, the second photoresist pattern PR2, the third mold layer ML3, and the second mold layer ML2 may be removed. The mask layer HM having the first to fourth holes IH1 to IH4 may be used as an etching mask to etch the etching target layer ETL, forming first to fourth holes IH1 to IH4 in the etching target layer ETL.

The mask layer HM may be removed. The first to fourth holes IH1 to IH4 of the etching target layer ETL may be filled with a conductive material to form first to fourth conductive patterns IL1 to IL4, respectively. The conductive material may include one or more of conductive metal nitride (e.g., titanium nitride or tantalum nitride) and metal (e.g., titanium, tantalum, tungsten, copper, or aluminum).

The third conductive pattern IL3 may include a first extension EP1, and the second conductive pattern IL2 may include a second extension EP2. The first and second holes EH1 and EH2 may be filled with a conductive material to form the first and second extensions EP1 and EP2, respectively. The first and second extensions EP1 and EP2 may be extremely close to each other. For example, the first and second extensions EP1 and EP2 may be in contact with each other. Thus, an electrical short may occur between the first and second extensions EP1 and EP2. For example, a bridge (e.g., an electrical short between adjacent patterns) may occur between the second conductive pattern IL2 and the third conductive pattern IL3, causing process defects on a semiconductor device.

Figure 7:
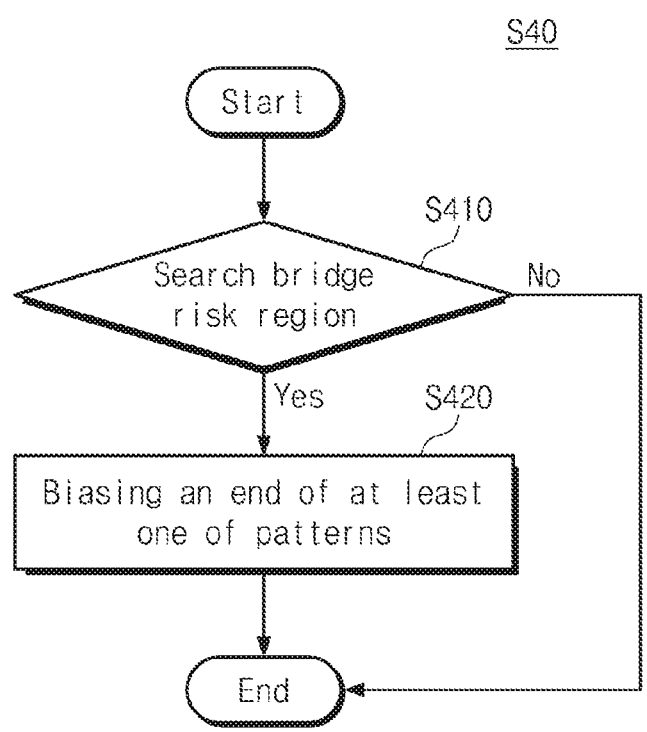
FIG. 7 illustrates a detailed flow chart of a line-end biasing operation S40 of FIG. 2, showing a line-end biasing method according to example embodiments of inventive concepts.

FIG. 7 illustrates a detailed flow chart of the line-end biasing operation S40 of FIG. 2, showing a line-end biasing method according to example embodiments of inventive concepts. FIGS. 8 to 12 illustrate plan views of layouts, showing a line-end biasing method according to example embodiments of inventive concepts. FIG. 13 illustrates a plan view showing a semiconductor device fabricated on a substrate, based on the layout of FIG. 12.

Figure 8:
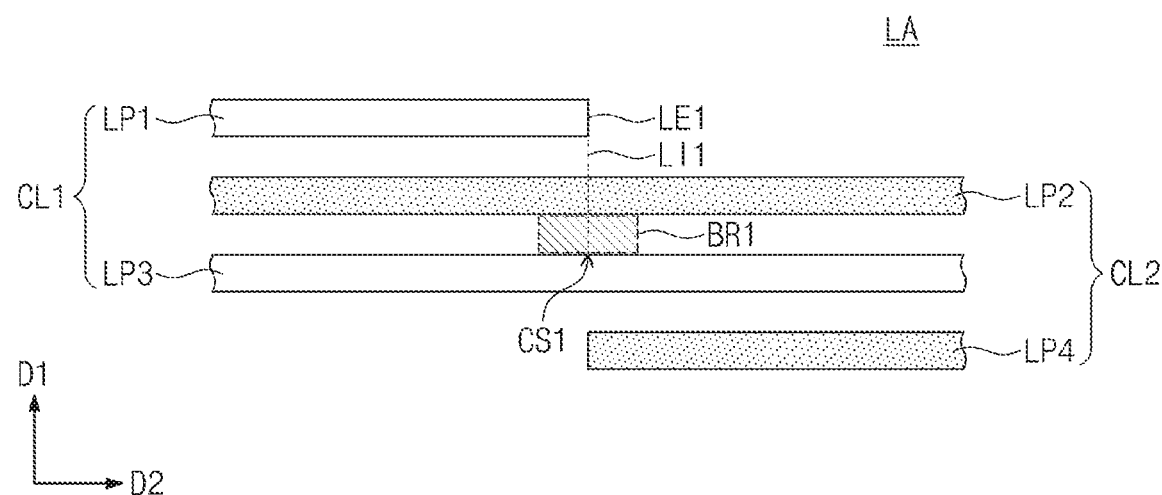
FIGS. 8 to 12 illustrate plan views of layouts, showing a line-end biasing method according to example embodiments of inventive concepts.

A line-end biasing method according to some example embodiments of inventive concepts may reduce or prevent the bridge discussed above with reference to FIGS. 3 and 4A to 6B. Referring to FIGS. 7 and 8, the layout LA of FIG. 3 may be examined to determine whether or not a bridge risk region is present (S410). There may be defined a first line LI1 in the first direction D1 passing through a first end LE1 of the first pattern LP1 included in the first group CL1. When neighboring ones of the first to fourth patterns LP1 to LP4 are arranged at one pitch, the first and third patterns LP1 and LP3 included in the first group CL1 may be arranged at two pitches. The first line LI1 may extend as much as two pitches from the first end LE1 toward the third pattern LP3. The first line LI1 may reach a first site CS1 of the third pattern LP3 included in the first group CL1.

A first bulging region BR1 may be defined on the first site CS1 of the third pattern LP3. The first bulging region BR1 may define an area where formed is the first extension EP1 discussed above with reference to FIG. 6A.

Figure 9:
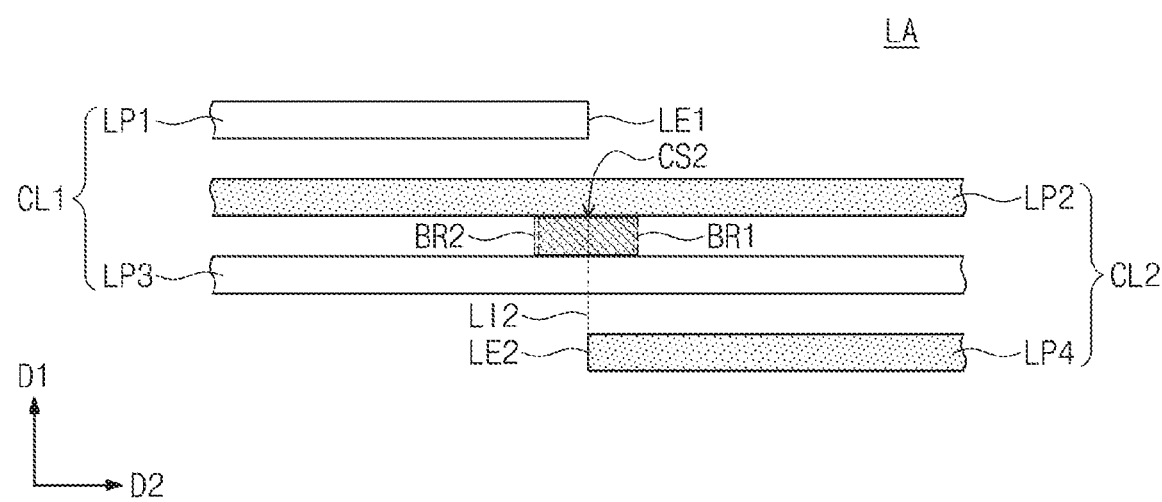

Referring to FIGS. 7 and 9, there may be defined a second line LI2 in the first direction D1 passing through a second end LE2 of the fourth pattern LP4 included in the second group CL2. The second line LI1 may extend as much as two pitches from the second end LE2 toward the second pattern LP2. The second line LI2 may reach a second site CS2 of the second pattern LP2 included in the second group CL2.

A second bulging region BR2 may be defined on the second site CS2 of the second pattern LP2. The second bulging region BR2 may define an area where formed is the second extension EP2 discussed above with reference to FIG. 6A.

Figure 10:
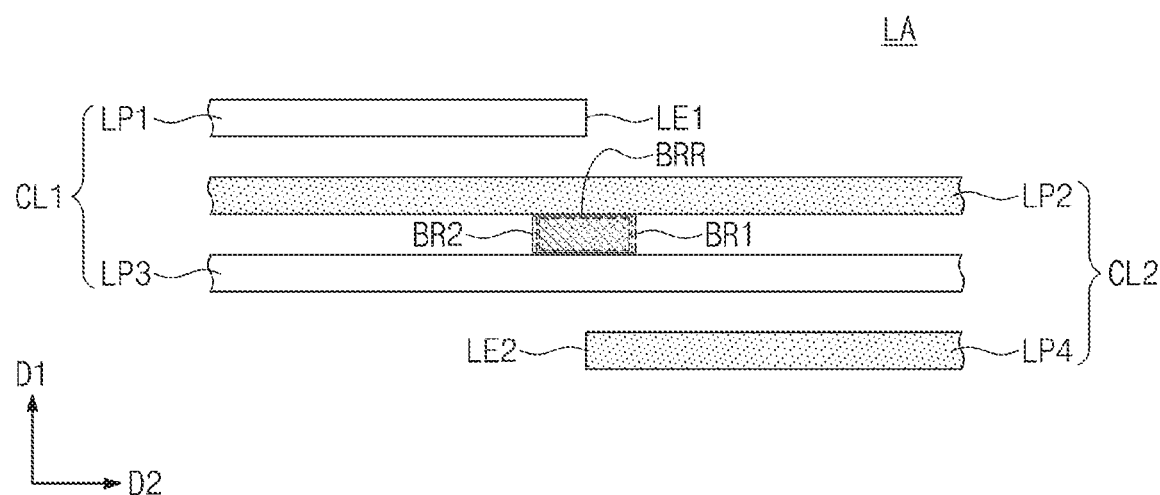

Referring to FIGS. 7 and 10, a bridge risk region BRR may be defined to indicate an area where the first bulging region BR1 and the second bulging region BR2 overlap each other. The bridge risk region BRR may define a zone where an electrical short occurs between the first and second extensions EP1 and EP2 discussed above with reference to FIG. 6A. For example, it may be examined to determine the presence of the area where the first bulging region BR1 and the second bulging region BR2 overlap each other, which attempt may ascertain whether or not the bridge risk region BRR is present.

Figure 11:
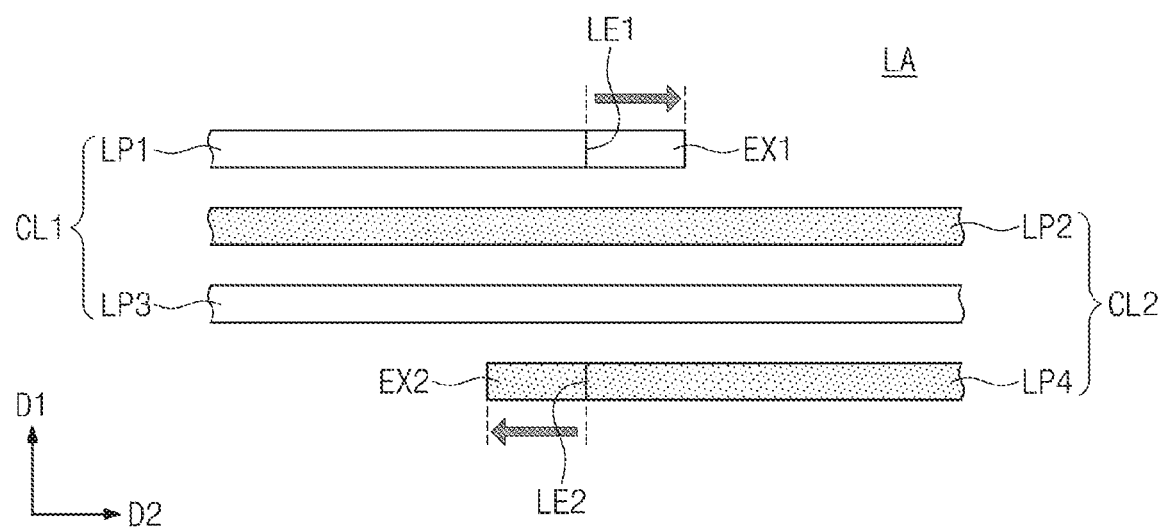

Referring to FIGS. 7 and 11, a biasing action may be performed on one or more of the first end LE1 and the second end LE2 adjacent to the bridge risk region BRR (S420). For example, the first end LE1 of the first pattern LP1 may change in position. The second end LE2 of the fourth pattern LP4 may change in position.

The biasing method may include placing an extension pattern EX1 or EX2 on one or more of the first end LE1 of the first pattern LP1 and the second end LE2 of the fourth pattern LP4. For example, a first extension pattern EX1 may be placed on the first end LE1 of the first pattern LP1, and a second extension pattern EX2 may be placed on the second end LE2 of the second pattern LP2.

Each of the first and second extension patterns EX1 and EX2 may have a bar shape extending in the second direction D2. Each of the first and second extension patterns EX1 and EX2 may have a width substantially the same as a width of each of the first to fourth patterns LP1 to LP4. The first and second extension patterns EX1 and EX2 may have substantially the same length or different lengths from each other. For example, the length of each of the first and second extension patterns EX1 and EX2 may be the same as or greater than a length of each of the first and second bulging regions BR1 and BR2.

Figure 12:
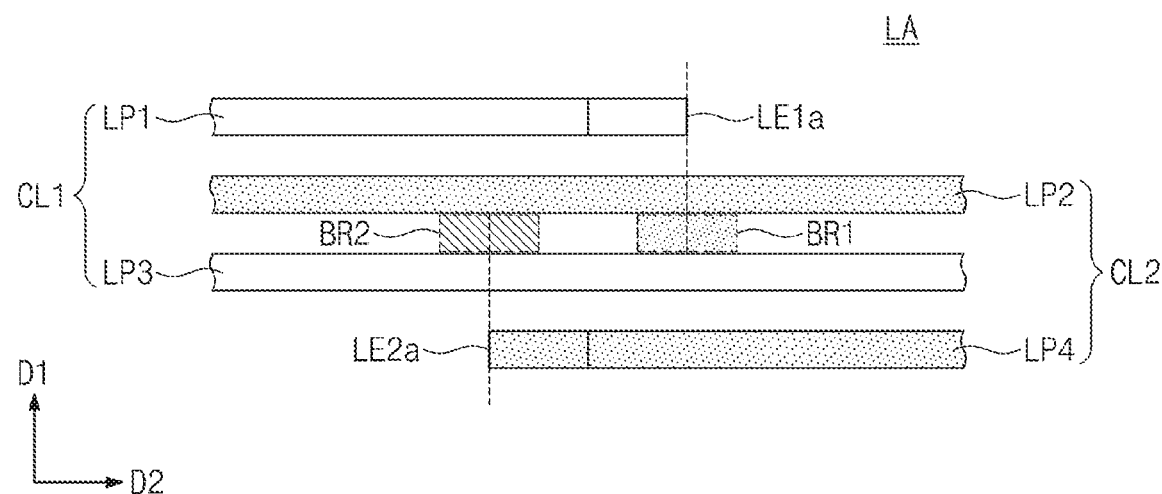
Figure 13:
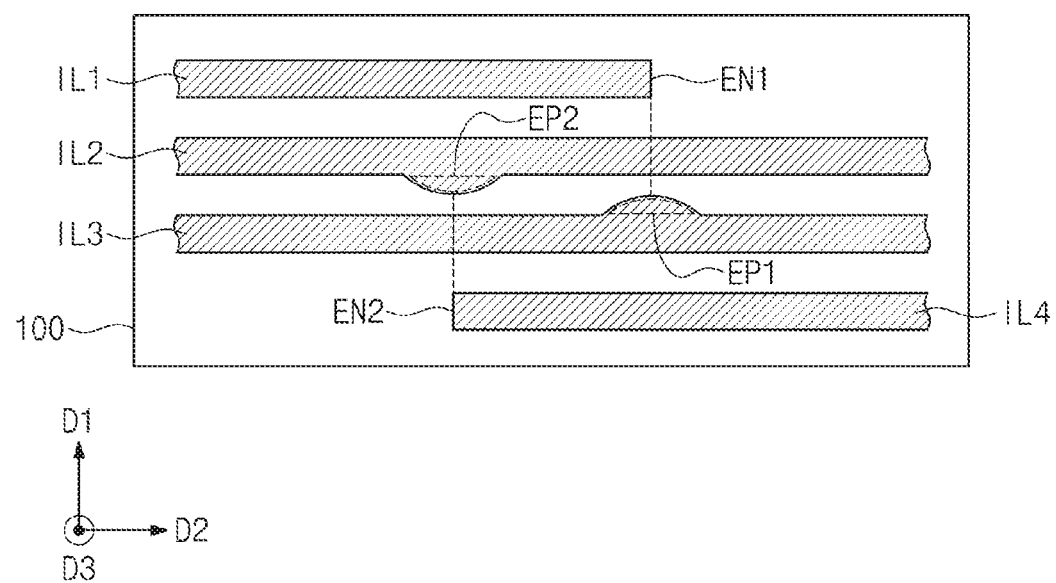
FIG. 13 illustrates a plan view showing a semiconductor device fabricated on a substrate, based on the layout of FIG. 12.

Referring to FIGS. 7 and 12, the first bulging region BR1 may be redefined based on a biased first end LE1a of the first pattern LP1. The second bulging region BR2 may be redefined based on a biased second end LE2a of the second pattern LP2. As the biasing action is performed on the first and second ends LE1 and LE2 of the first and second patterns LP1 and LP2, the first bulging region BR1 and the second bulging region BR2 may not overlap each other but become spaced apart from each other in the second direction D2. For example, the bridge risk region BRR may not exist in the biased layout LA.

Referring to FIG. 13, based on the biased layout LA of FIG. 12, the first to fourth conductive patterns IL1 to IL4 may be formed on the substrate 100. The formation of the first to fourth conductive patterns IL1 to IL4 may be similar to that discussed above with reference to FIGS. 4A to 6B. The first extension EP1 of the third conductive pattern IL3 may be aligned in the first direction D1 with a first end EN1 of the first conductive pattern IL1. The second extension EP2 of the second conductive pattern IL2 may be aligned in the first direction D1 with a second end EN2 of the fourth conductive pattern IL4.

The first extension EP1 of the third conductive pattern IL3 shown in FIG. 13 may be spaced apart in the second direction D2 from the second extension EP2 of the second conductive pattern IL2. A semiconductor device according to some example embodiments of inventive concepts may not have the bridge, shown above in FIG. 6A, between the second and third conductive patterns IL2 and IL3.

Figure 14:
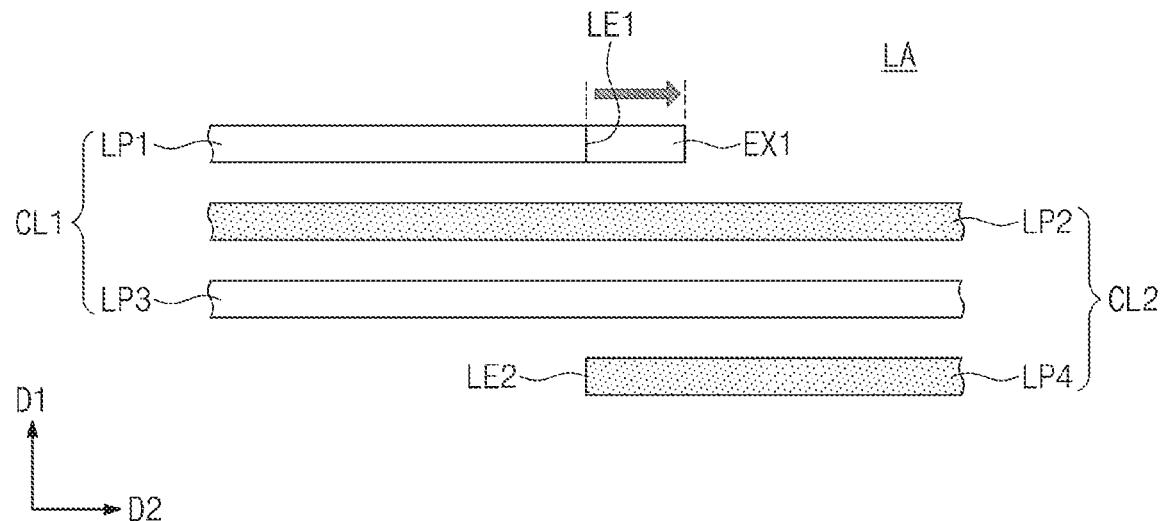
FIGS. 14 and 16 illustrate plan views of layouts, showing a line-end biasing method according to example embodiments of inventive concepts.
Figure 15:
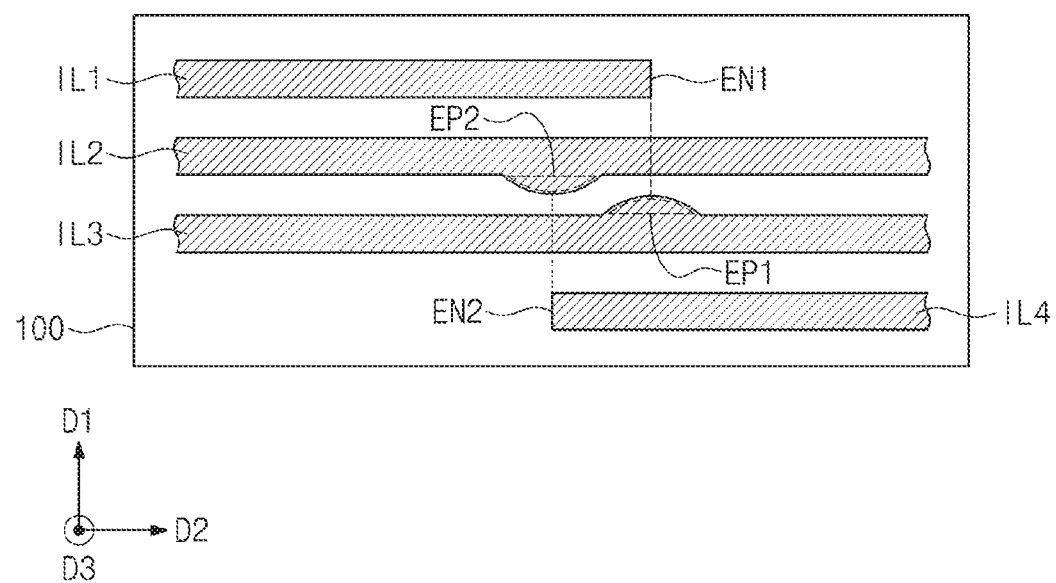
FIGS. 15 and 17 illustrate plan views showing a semiconductor device fabricated on a substrate, based on the layouts of FIGS. 14 and 16, respectively.
Figure 16:
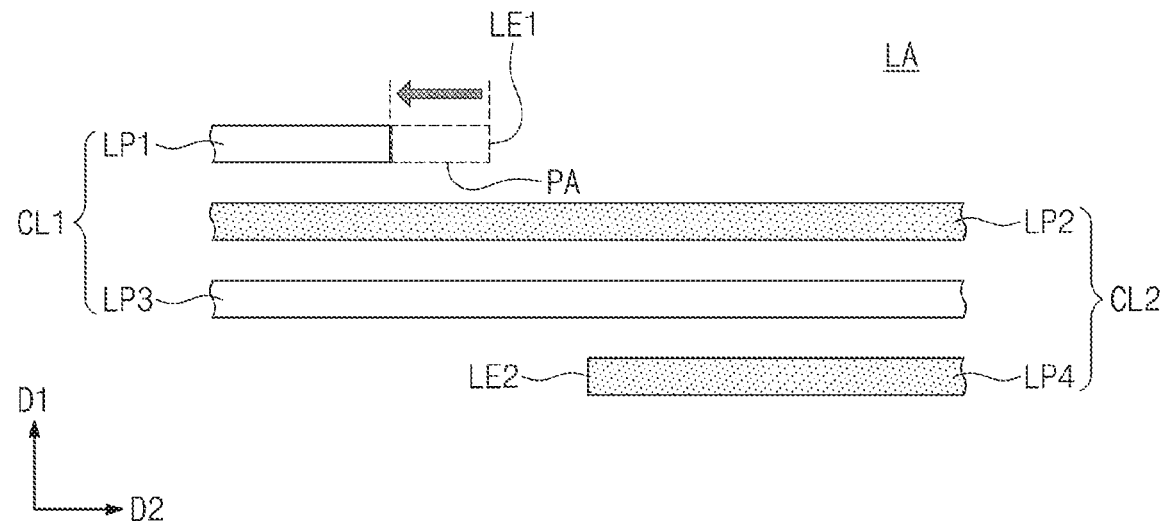
Figure 17:
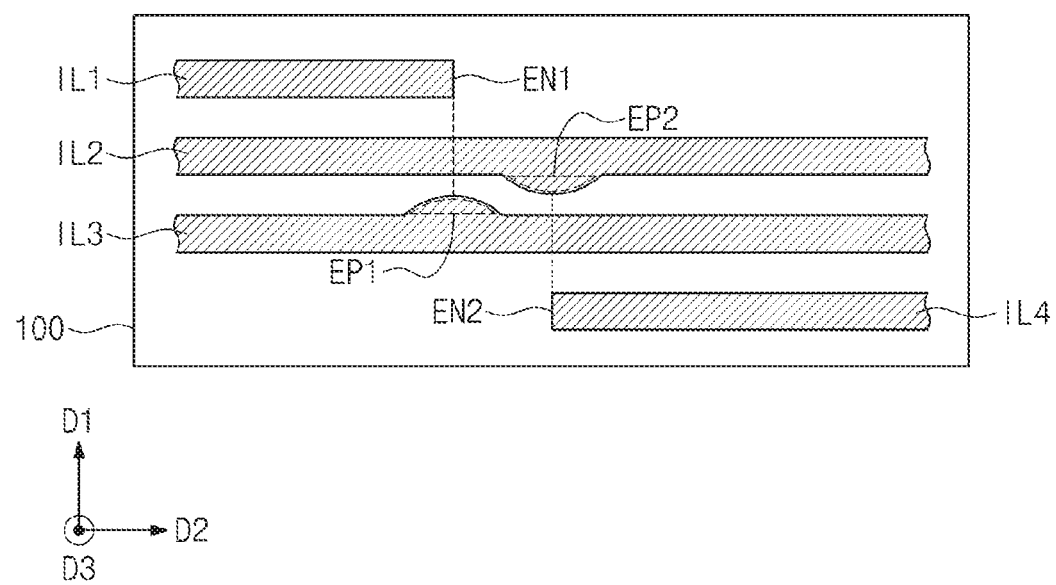

FIGS. 14 and 16 illustrate plan views of layouts, showing a line-end biasing method according to example embodiments of inventive concepts. FIGS. 15 and 17 illustrate plan views showing a semiconductor device fabricated on a substrate, based on the layouts of FIGS. 14 and 16, respectively.

Referring to FIGS. 7, 14, and 15, a biasing action may be performed on one or more of the first end LE1 and the second end LE2 adjacent to the bridge risk region BRR (S420). For example, the biasing method may include placing a first extension pattern EX1 on the first end LE1 of the first pattern LP1. The first end LE1 alone may be biased, while the second end LE2 may not be biased.

When the first end LE1 is sufficiently biased, for example, when the first end LE1 extends as much as at least the first bulging region BR1, the bridge risk region BRR may be removed. As illustrated in FIG. 15, the first extension EP1 may be spaced apart in the second direction D2 from the second extension EP2, which arrangement may in turn reduce or prevent the bridge.

Alternatively, referring to FIGS. 7, 16, and 17, a biasing action may be performed on one or more of the first end LE1 and the second end LE2 adjacent to the bridge risk region BRR (S420). The biasing method may include pulling back the first end LE1 of the first pattern LP1. For example, the biasing method may include removing a portion PA that constitutes the first end LE1 of the first pattern LP.

When the first end LE1 is sufficiently biased, for example, when the first end LE1 is pulled back as much as at least the first bulging region BR1, the bridge risk region BRR may be removed. As illustrated in FIG. 17, the second extension EP2 may be spaced apart in the second direction D2 from the first extension EP1, which arrangement may in turn reduce or prevent the bridge.

Figure 18:
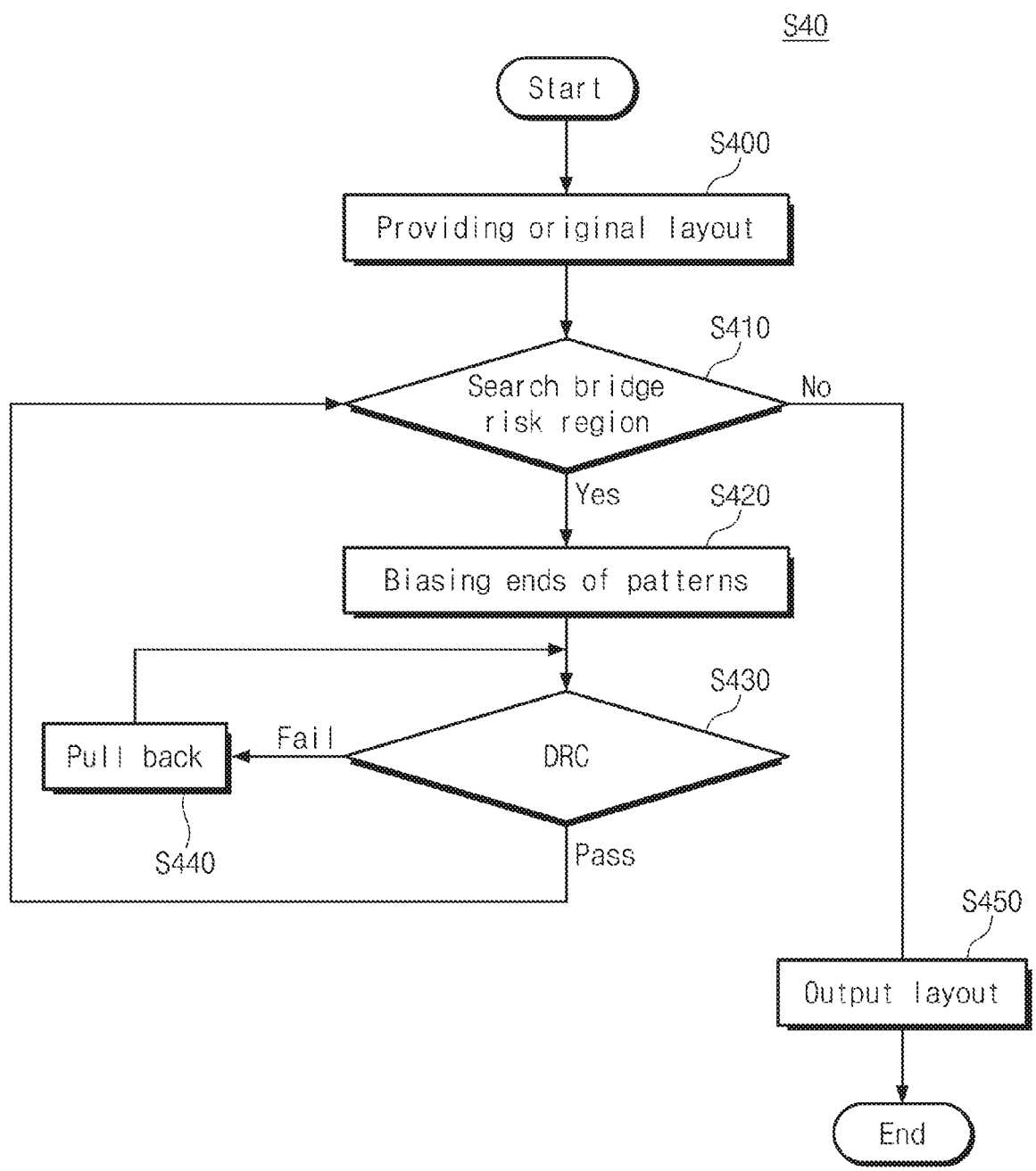
FIG. 18 illustrates a flow chart showing a line-end biasing method according to example embodiments of inventive concepts.

FIG. 18 illustrates a flow chart showing a line-end biasing method according to example embodiments of inventive concepts. FIGS. 19 to 27 illustrate plan views of layouts, showing a line-end biasing method according to example embodiments of inventive concepts. FIG. 28 illustrates a plan view showing a semiconductor device fabricated on a substrate, based on the layout of FIG. 27. In the example embodiments that follow, a detailed description of technical features repetitive to those discussed above with reference to FIGS. 7 to 13 will be omitted, and a difference thereof will be explained in more detail.

Figure 19:
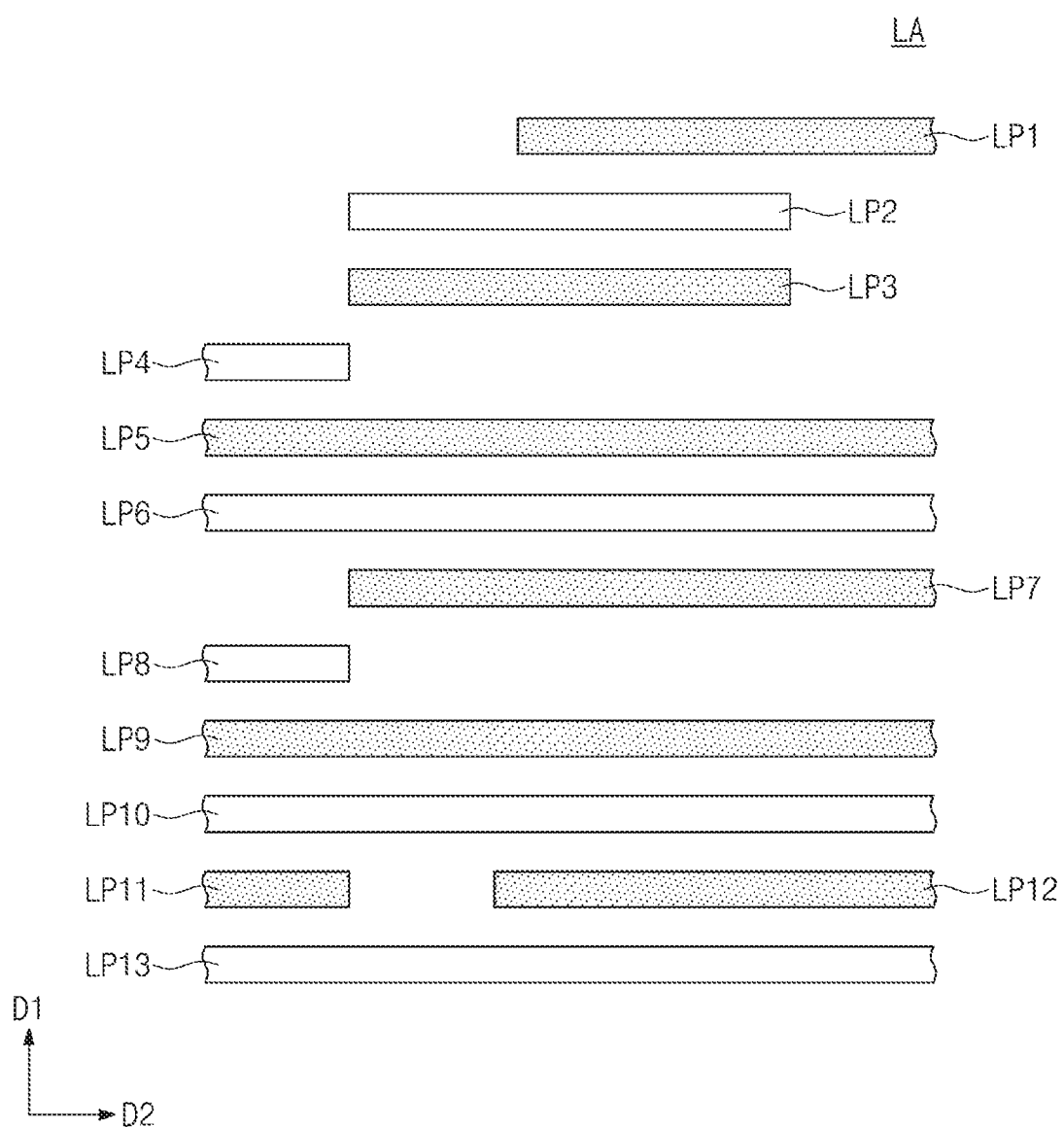
FIGS. 19 to 27 illustrate plan views of layouts, showing a line-end biasing method according to example embodiments of inventive concepts.

Referring to FIGS. 18 and 19, a layout LA may be provided to include first to thirteenth patterns LP1 to LP13 (S400). Each of the first to thirteenth patterns LP1 to LP13 may have a linear or bar shape extending in a second direction D2. Neighboring ones of the first to thirteenth patterns LP1 to LP13 may be arranged at substantially the same pitch.

The second, fourth, sixth, eighth, tenth, and thirteenth patterns LP2, LP4, LP6, LP8, LP10, and LP13 may constitute a first group. The first, third, fifth, seventh, ninth, eleventh, and twelfth patterns LP1, LP3, LP5, LP7, LP9, LP11, and LP12 may constitute a second group. A first photomask may be fabricated based on the first group, and a second photomask may be fabricated based on the second group.

Figure 20:
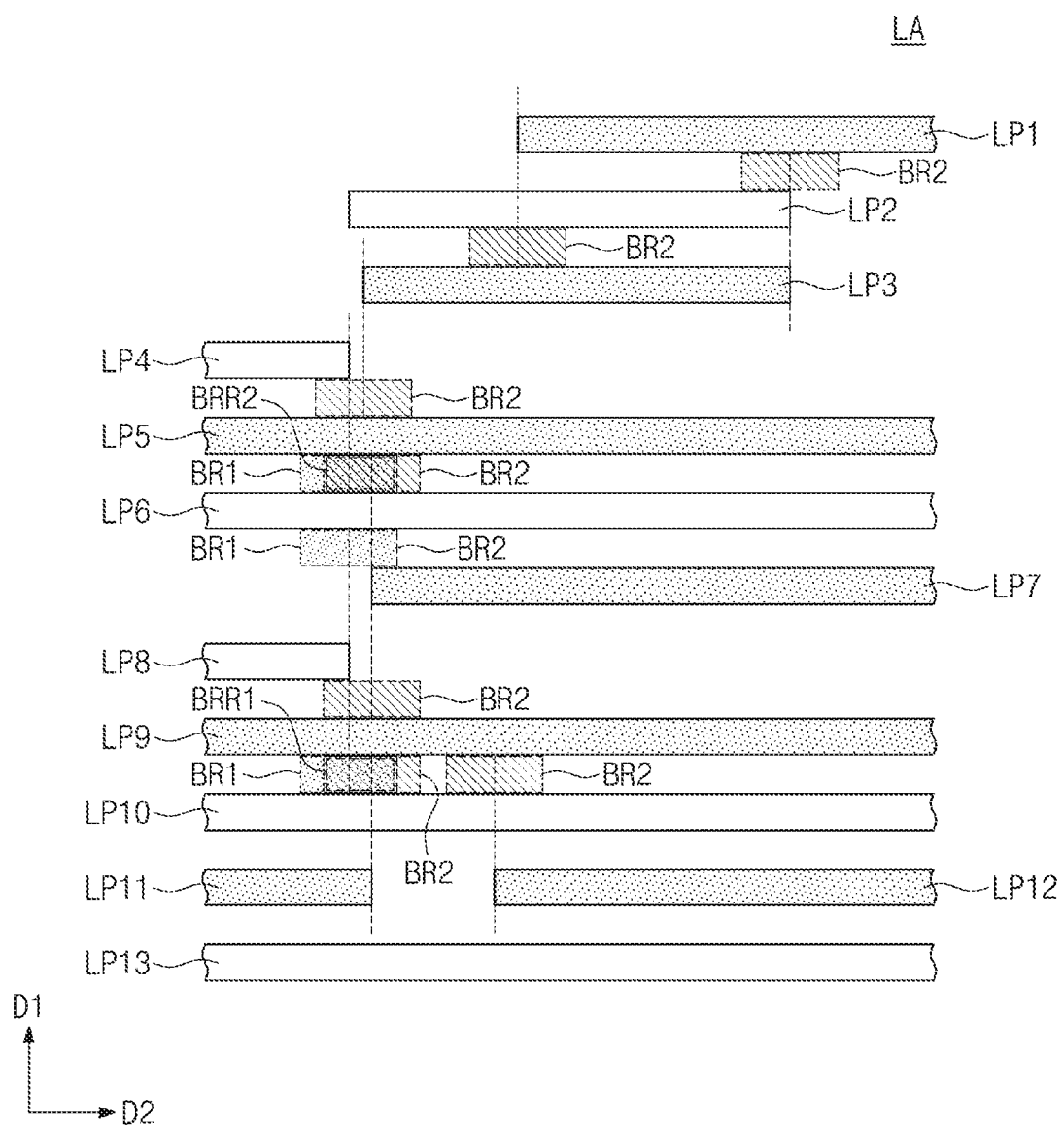

Referring to FIGS. 18 and 20, the layout LA may be examined to determine whether or not a bridge risk region is present (S410). Based on one end of the fourth pattern LP4, a first bulging region BR1 may be defined on one side of the sixth pattern LP6. Based on one end of the eighth pattern LP8, a first bulging region BR1 may be defined on an opposite side of the sixth pattern LP6 and one side of the tenth pattern LP10. Based on one end of the first pattern LP1, a second bulging region BR2 may be defined on one side of the third pattern LP3. Based on one end of the third pattern LP3, a second bulging region BR2 may be defined on one side of the first pattern LP1. Based on an opposite end of the third pattern LP3, a second bulging region BR2 may be defined on one side of the fifth pattern LP5. Based on one end of the seventh pattern LP7, a second bulging region BR2 may be defined on an opposite side of the fifth pattern LP5 and one side of the ninth pattern LP9. Based on one end of the eleventh pattern LP11, a second bulging region BR2 may be defined on an opposite side of the ninth pattern LP9. Based on one end of the twelfth pattern LP12, a second bulging region BR2 may be defined on the opposite side of the ninth pattern LP9.

Between the ninth pattern LP9 and the tenth pattern LP10, a first bridge risk region BRR1 may be defined to indicate an area where the first bulging region BR1 and the second bulging region BR2 overlap each other. Between the fifth pattern LP5 and the sixth pattern LP6, a second bridge risk region BRR2 may be defined to indicate an area where the first bulging region BR1 and the second bulging region BR2 overlap each other. The overlapping area between the first and second bulging regions BR1 and BR2 may be examined to ascertain whether or not the bridge risk region is present in the layout LA of FIG. 20.

Figure 21:
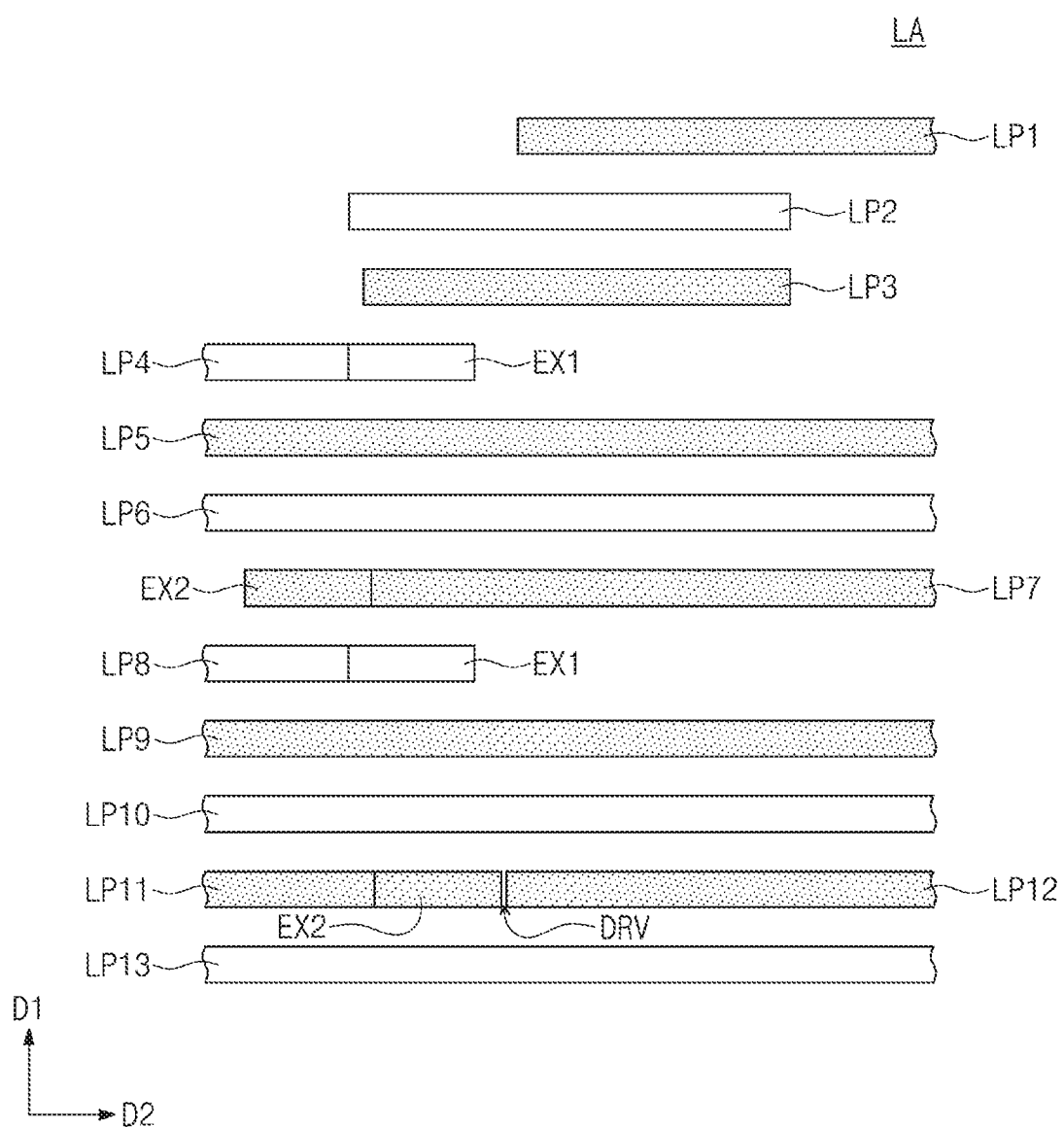

Referring to FIGS. 18 and 21, a first biasing action may be performed on pattern ends adjacent to the bridge risk region (S420). A biasing action may be performed on an end of each of the eighth and eleventh patterns LP8 and LP11 adjacent to the first bridge risk region BRR1. A biasing action may be performed on an end of each of the fourth and seventh patterns LP4 and LP7 adjacent to the second bridge risk region BRR2. For example, a first extension pattern EX1 may be placed on the end of each of the fourth and eighth patterns LP4 and LP8. A second extension pattern EX2 may be placed on the end of each of the seventh and eleventh patterns LP7 and LP11.

The biased layout LA may undergo a design rule check (DRC) for verifying whether or not any portion violates a design rule (S430). The twelfth pattern LP12 and the second extension pattern EX2 placed on the eleventh pattern LP11 may be spaced apart in the second direction D2 from each other at a distance less than a minimum distance defined by the design rule. For example, a design rule violation (DRV) may exist between the twelfth pattern LP12 and the second extension pattern EX2 placed on the eleventh pattern LP11.

Figure 22:
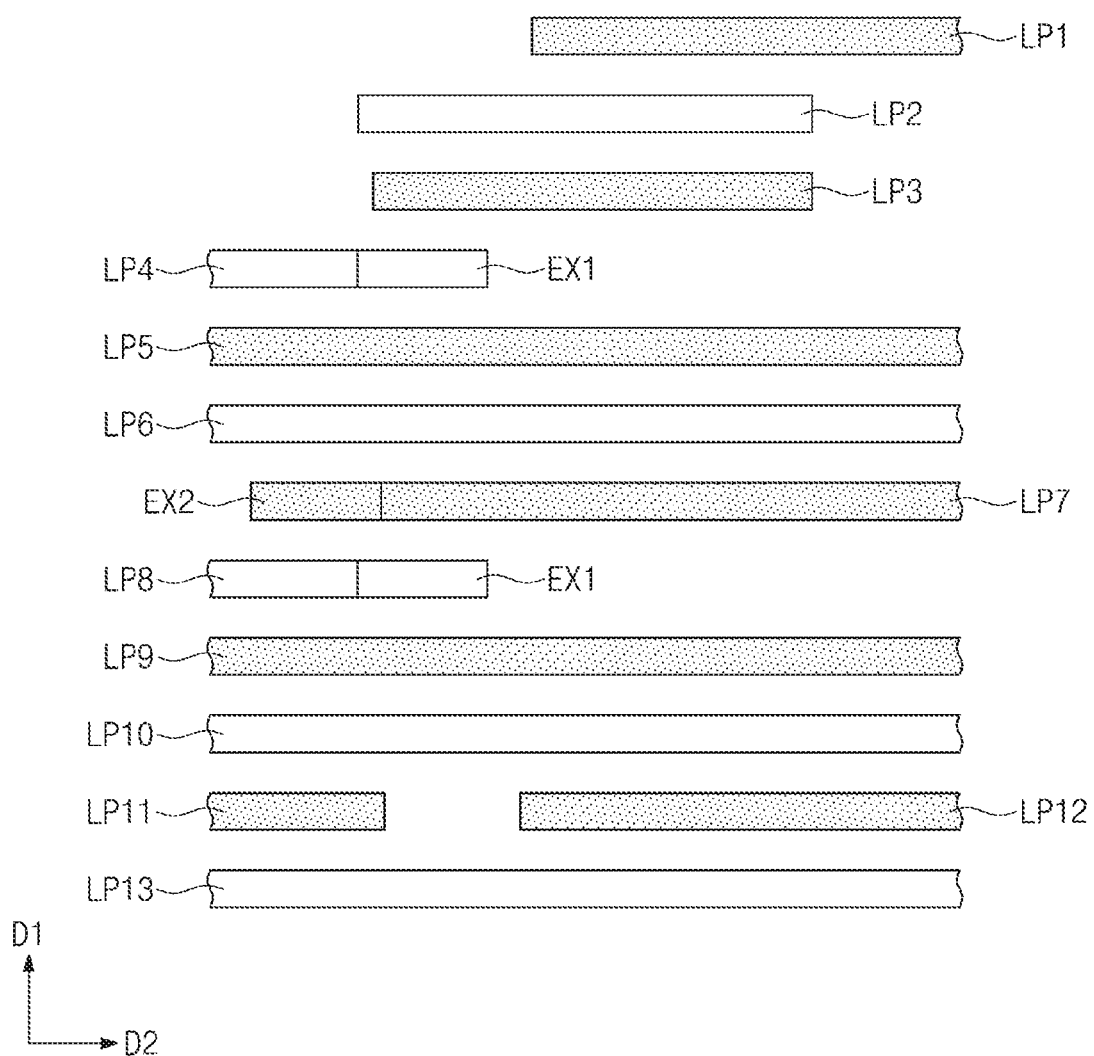

Referring to FIGS. 18 and 22, a cancel action may be performed on the biased eleventh pattern LP11 that violates the design rule (S440). For example, the second extension pattern EX2 may be removed from the end of the eleventh pattern LP11. The design rule may then be satisfied between the eleventh pattern LP11 and the twelfth pattern LP12.

Figure 23:
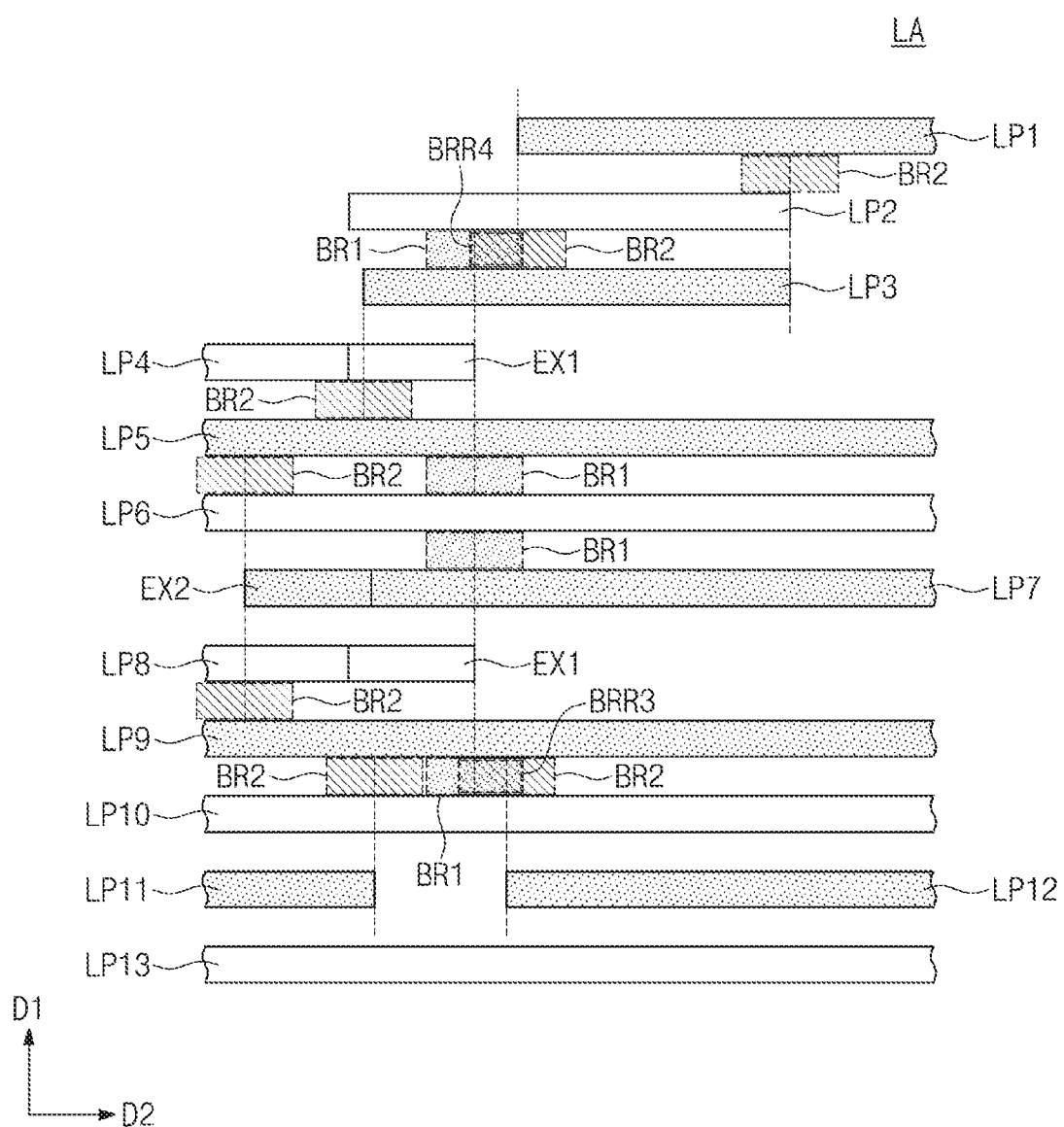

Referring to FIGS. 18 and 23, the biased layout LA may be reexamined to determine whether or not the bridge risk region is present (S410). Based on the one end of the fourth pattern LP4, a first bulging region BR2 may be defined on one side of the second pattern LP2 and the one side of the sixth pattern LP6. Based on the one end of the eighth pattern LP8, a first bulging region BR1 may be defined on the opposite side of the sixth pattern LP6 and the one side of the tenth pattern LP10. Based on the one end of the first pattern LP1, a second bulging region BR2 may be defined on the one side of the third pattern LP3. Based on the one end of the third pattern LP3, a second bulging region BR2 may be defined on the one side of the first pattern LP1. Based on the opposite end of the third pattern LP3, a second bulging region BR2 may be defined on the one side of the fifth pattern LP5. Based on the one end of the seventh pattern LP7, a second bulging region BR2 may be defined on the opposite side of the fifth pattern LP5 and the one side of the ninth pattern LP9. Based on the one end of the eleventh pattern LP11, a second bulging region BR2 may be defined on the opposite side of the ninth pattern LP9. Based on one end of the twelfth pattern LP12, a second bulging region BR2 may be defined on the opposite side of the ninth pattern LP9.

Between the ninth pattern LP9 and the tenth pattern LP10, a third bridge risk region BRR3 may be defined to indicate an area where the first bulging region BR1 and the second bulging region BR2 overlap each other. Between the second pattern LP2 and the third pattern LP3, a fourth bridge risk region BRR2 may be defined to indicate an area where the first bulging region BR1 and the second bulging region BR2 overlap each other. Although the first biasing action removes the first and second bridge risk regions BRR1 and BRR2 discussed above, it may be ascertained that the third and fourth bridge risk regions BRR3 and BRR4 are newly formed.

Figure 24:
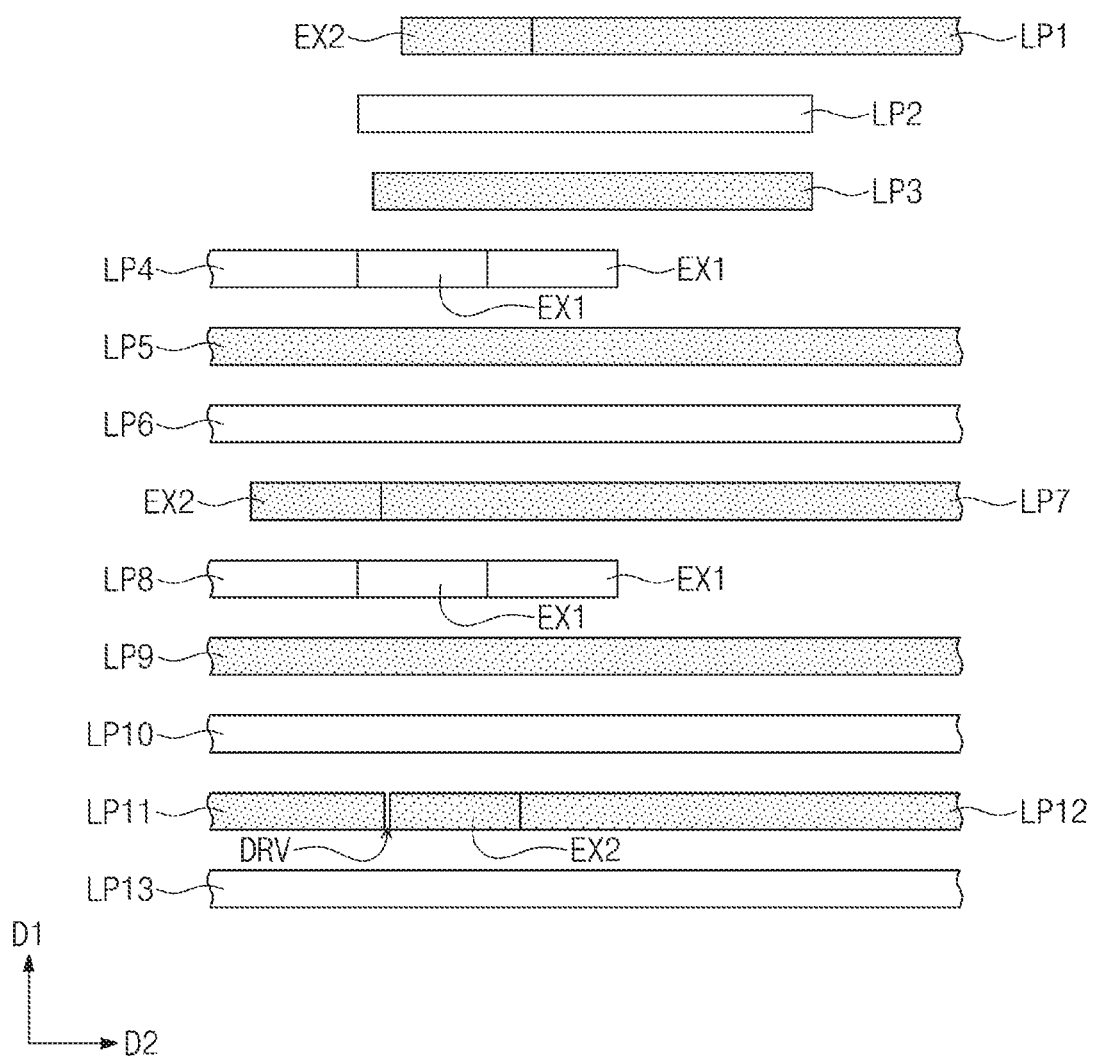

Referring to FIGS. 18 and 24, a second biasing action may be performed on pattern ends adjacent to the bridge risk region (S420). A biasing action may be performed on an end of each of the eighth and twelfth patterns LP8 and LP12 adjacent to the third bridge risk region BRR3. A biasing action may be performed on an end of each of the first and fourth patterns LP1 and LP4 adjacent to the fourth bridge risk region BRR4. For example, a first extension pattern EX1 may be placed on the end of each of the fourth and eighth patterns LP4 and LP8. A second extension pattern EX2 may be placed on the end of each of the first and twelfth patterns LP1 and LP12.

The biased layout LA may undergo a design rule check (DRC) for verifying whether or not any portion violates a design rule (S430). The twelfth pattern LP12 and the second extension pattern EX2 placed on the eleventh pattern LP11 may be spaced apart in the second direction D2 from each other at a distance less than a minimum distance defined by the design rule. For example, a design rule violation (DRV) may exist between the twelfth pattern LP12 and the second extension pattern EX2 placed on the eleventh pattern LP11.

Figure 25:
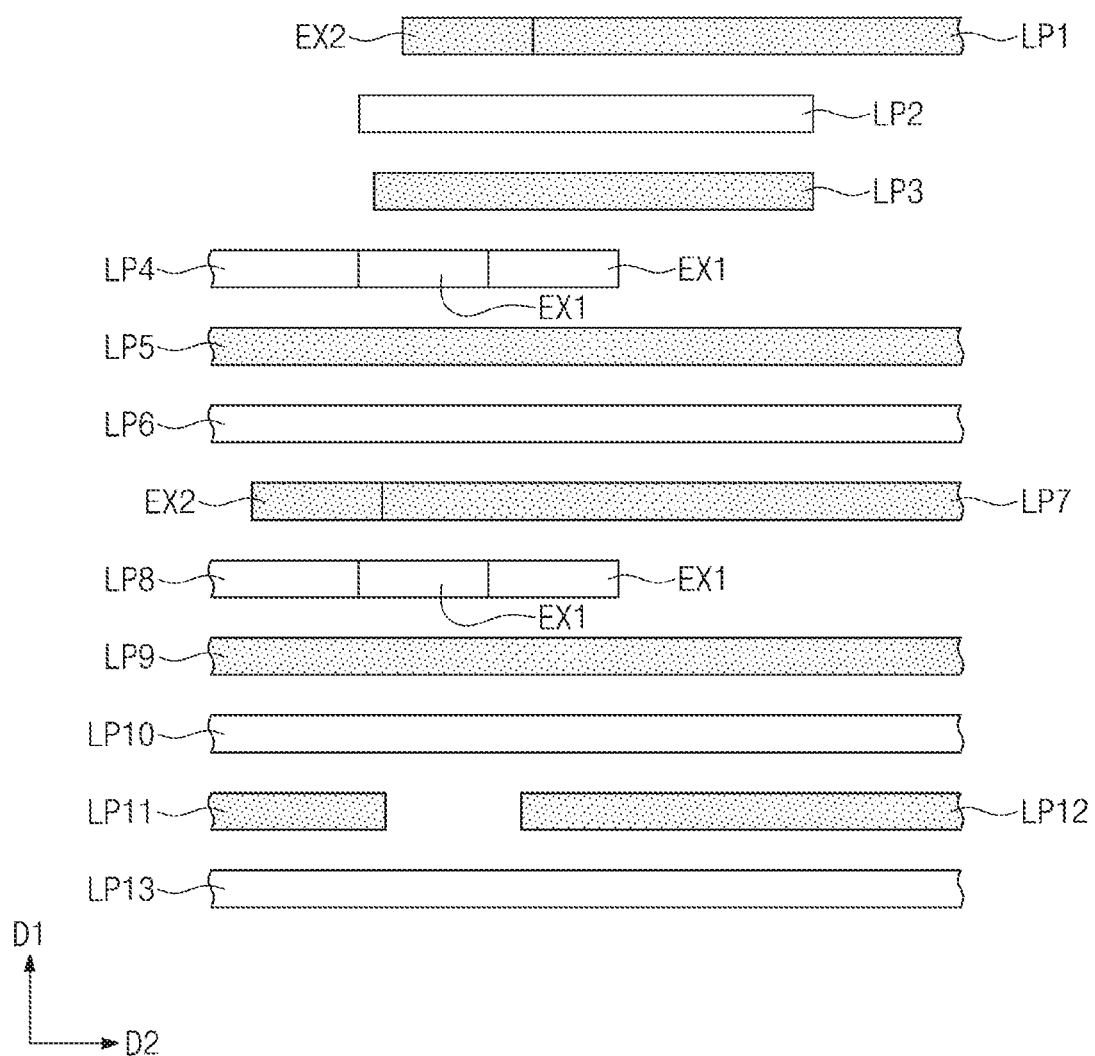

Referring to FIGS. 18 and 25, a cancel action may be performed on the biased twelfth pattern LP12 that violates the design rule (S440). For example, the second extension pattern EX2 may be removed from the end of the twelfth pattern LP12. The design rule may then be satisfied between the eleventh pattern LP11 and the twelfth pattern LP12.

Figure 26:
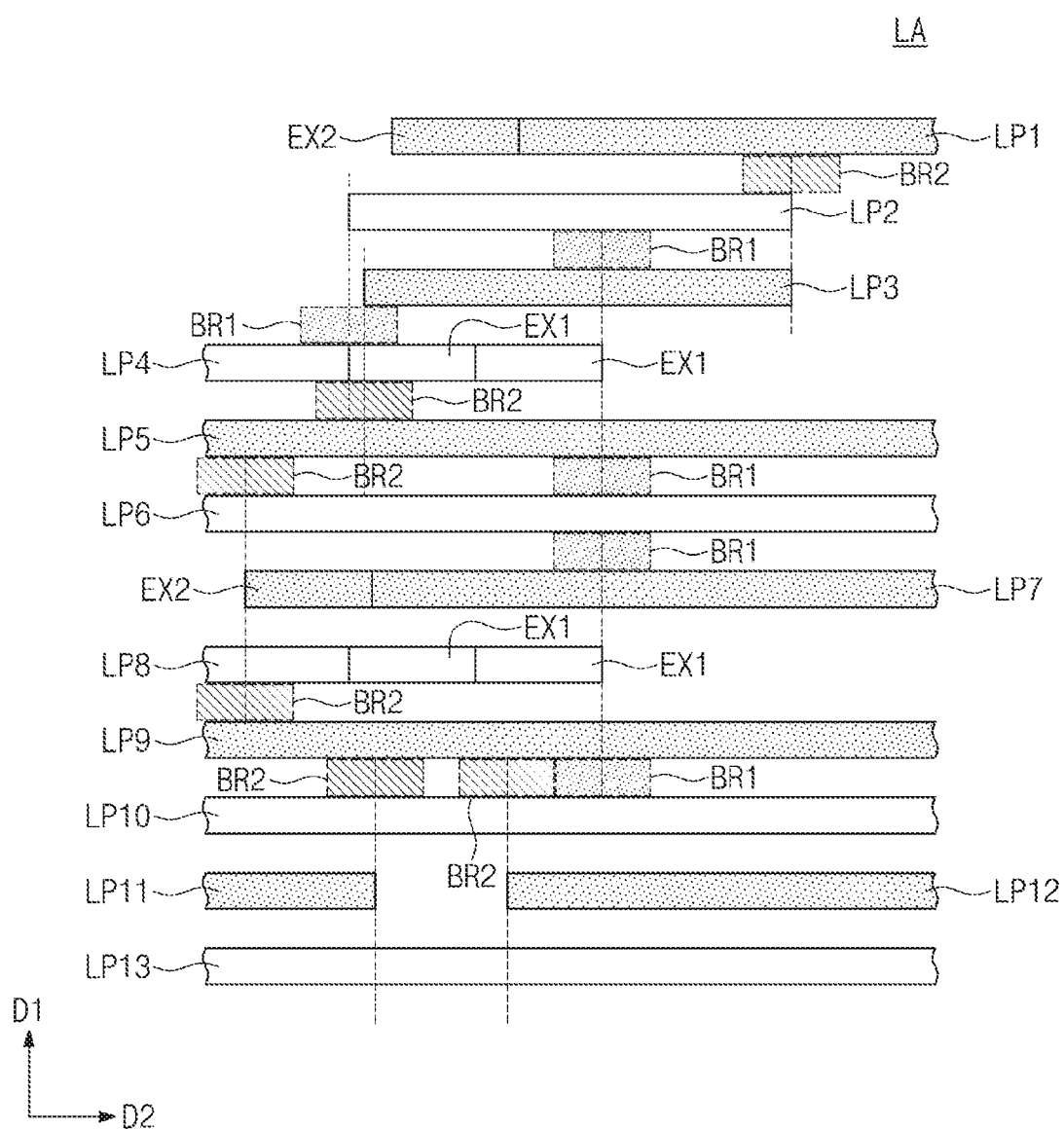

Referring to FIGS. 18 and 26, the biased layout LA may be reexamined to determine whether or not the bridge risk region is present (S410). First bulging regions BR1 may be defined based on the end of each of the second, fourth, and eighth patterns LP2, LP4, and LP8. Second bulging regions BR2 may be defined based on the end of each of the third, seventh, eleventh, and twelfth patterns LP3, LP7, LP11, and LP12. The layout LA of FIG. 26 may have therein no overlapping area between the first bulging region BR1 and the second bulging region BR2. For example, it may be ascertained that the bridge risk region does not exist in the layout LA of FIG. 26.

Figure 27:
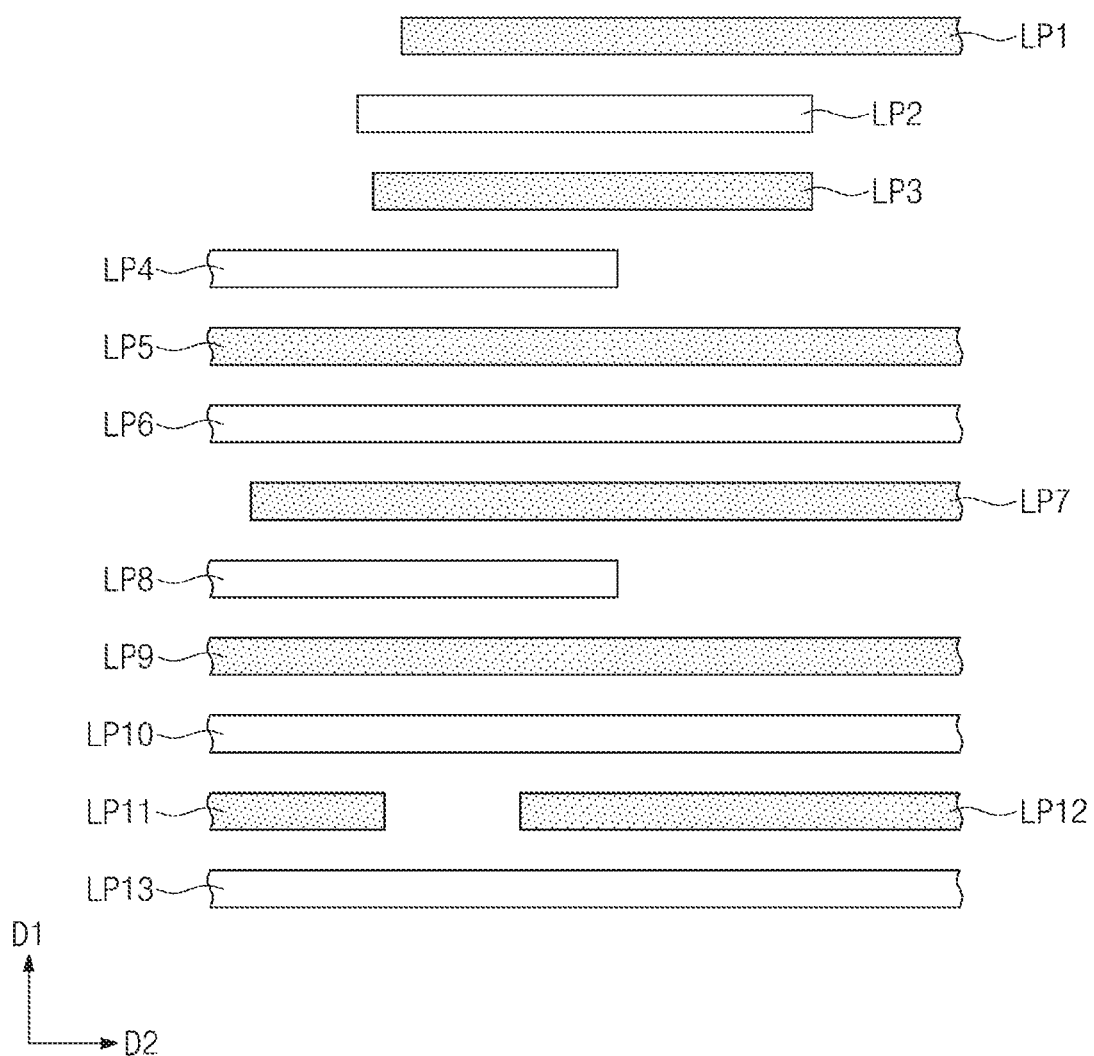
Figure 28:
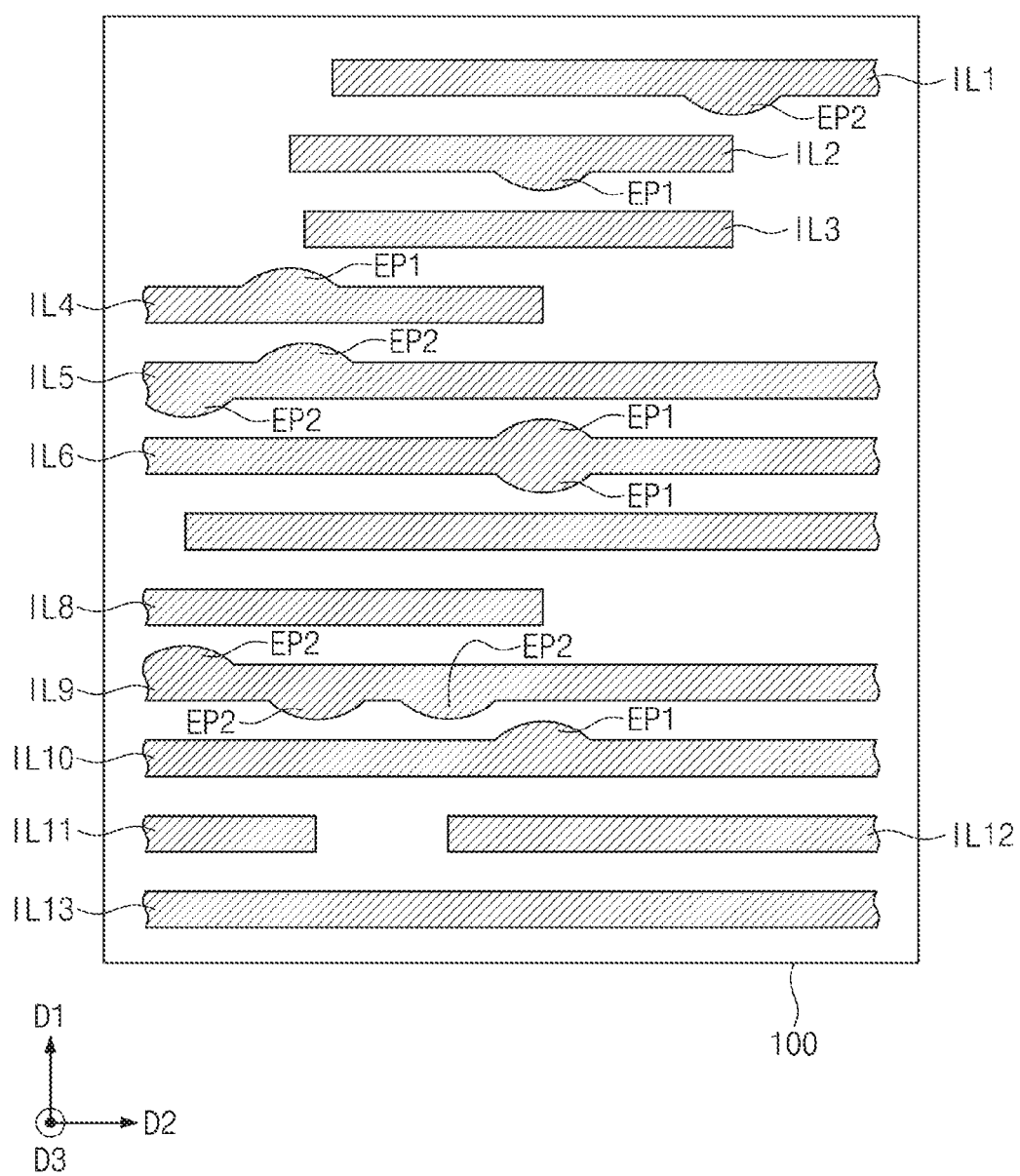
FIG. 28 illustrates a plan view showing a semiconductor device fabricated on a substrate, based on the layout of FIG. 27.

Referring to FIGS. 18 and 27, a final layout LA may be obtained from the layout that has experienced the first biasing action and the second biasing action. For example, each of the first and second extension patterns EX1 and EX2 may be combined with its connected pattern, thereby completing the final layout LA.

Referring to FIG. 28, based on the layout LA of FIG. 27, first to twelfth conductive patterns IL1 to IL12 may be formed on the substrate 100. The formation of the first to twelfth conductive patterns IL1 to IL12 may be similar to that discussed above with reference to FIGS. 4A to 6B.

Each of the second, fourth, sixth, and tenth conductive patterns IL2, IL4, IL6, and IL10 may include a first extension EP1. The first extension EP1 may correspond to the first bulging region BR1 discussed above in FIG. 26. The sixth conductive pattern IL6 may include a first extension EP1 at one side thereof and a first extensions EP1 at an opposite side thereof.

Each of the first, fifth, and ninth conductive patterns ILL IL5, and IL9 may include a second extension EP2. The second extension EP2 may correspond to the second bulging region BR2 discussed above in FIG. 26. The fifth conductive pattern IL5 may include a second extension EP2 at one side thereof and a second extension EP2 at an opposite side thereof. The ninth conductive pattern IL9 may include a second extension EP2 at one side thereof and a plurality of second extensions EP2 at an opposite side thereof.

A semiconductor device according to some example embodiments of inventive concepts may be fabricated by a layout design including a line-end biasing action. When a plurality of photomasks are used to form conductive patterns on a substrate, a bridge may be reduced or prevented between the conductive patterns. In conclusion, the semiconductor device may be provided to have improved reliability.

Although example embodiments of the present inventive concepts have been discussed with reference to accompanying figures, it will be understood that various changes in form and details may be made therein without departing from the spirit and scope of the present inventive concepts. It therefore will be understood that the example embodiments described above are just illustrative but not limitative in all aspects.

What is claimed is:

1. A method of manufacturing a semiconductor device, the method comprising:
    providing a layout comprising a first group and a second group, the first group including a first pattern and a second pattern, the second group including a third pattern and a fourth pattern;
    examining a bridge risk region in the layout;
    biasing one end of at least one of the first and third patterns; and
    forming first to fourth conductive patterns by using the first to fourth patterns of the layout, respectively,
    wherein the one end of at least one of the first and third patterns is adjacent to the bridge risk region.

2. The method of claim 1, wherein
    the first to fourth patterns extend in parallel to each other in a first direction, and the one end of at least one of the first and third patterns is adjacent to the bridge risk region in a second direction crossing the first direction.

3. The method of claim 1, wherein examining the bridge risk region comprises:
defining a first bulging region on one side of the second pattern, based on one end of the first pattern;
defining a second bulging region on one side of the fourth pattern, based on one end of the third pattern; and
defining the bridge risk region that indicates an area where the first bulging region and the second bulging region overlap.

4. The method of claim 3, wherein, after biasing, the first bulging region and the second bulging region are spaced apart from each other.

5. The method of claim 3, wherein
a first extension is formed on one side of the second conductive pattern, the first extension corresponding to the first bulging region, and
a second extension is formed on one side of the fourth conductive pattern, the second extension corresponding to the second bulging region.

6. The method of claim 1, wherein biasing comprises placing an extension pattern on the one end of at least one of the first and third patterns.

7. The method of claim 1, wherein biasing comprises removing a portion of at least one of the first and third patterns.

8. The method of claim 1, wherein, after biasing, further comprising performing a design rule check on the layout.

9. The method of claim 1, wherein neighboring ones of the first to fourth patterns are arranged at substantially the same pitch.

10. The method of claim 1, wherein
the fourth pattern is disposed between the first and second patterns, and
the second pattern is disposed between the third and fourth patterns.

11. The method of claim 1, wherein forming the first to fourth conductive patterns comprises:
using the first group of the layout to fabricate a first photomask;
using the second group of the layout to fabricate a second photomask;
using the first photomask to perform a first photolithography process on a substrate; and
using the second photomask to perform a second photolithography process on the substrate.

12. A method of manufacturing a semiconductor device, the method comprising:
providing a layout;
performing a line-end biasing on the layout; and
using the layout to form conductive patterns on a substrate,
wherein performing the line-end biasing comprises:
examining a bridge risk region in the layout;
biasing one end of at least one of patterns in the layout, the one end being adjacent to the bridge risk region; and
performing a design rule check.

13. The method of claim 12, wherein the line-end biasing is repeatedly performed.

14. The method of claim 12, wherein a first pattern of the biased patterns violates a design rule,
wherein performing the line-end biasing further comprises cancelling the biasing performed on the first pattern.

15. The method of claim 12, wherein performing the line-end biasing comprises placing an extension pattern on the one end of at least one of patterns.

16. The method of claim 12, wherein
the patterns in the layout extend in parallel to each other in a first direction, and
the one end of at least one of patterns is adjacent to the bridge risk region in a second direction crossing the first direction.

17. A method of manufacturing a semiconductor device, the method comprising:
providing a layout including a first pattern, a second pattern, a third pattern and a fourth pattern that are sequentially arranged in a first direction, the first and third patterns constituting a first group, the second and fourth patterns constituting a second group, the first pattern having a first end, the fourth pattern having a second end;
generating a first bulging region on one side of the third pattern aligned with the first end in the first direction;
generating a second bulging region on one side of the second pattern aligned with the second end in the first direction;
defining a bridge risk region on an area where the first bulging region and the second bulging region overlap;
biasing at least one of the first and second ends of the first and fourth patterns, the at least one end of the first and second ends of the first and fourth patterns being adjacent to the bridge risk region; and
forming first to fourth conductive patterns by using the first to fourth patterns of the layout, respectively.

18. The method of claim 17, wherein the bridge risk region indicates a zone where an electrical short occurs between the second conductive pattern and the third conductive pattern.

19. The method of claim 17, wherein the first to fourth patterns extend in parallel to each other in a second direction crossing the first direction.

20. The method of claim 17, wherein, after biasing, the first bulging region and the second bulging region are spaced apart from each other.

* * * * *